United States Patent
Sano et al.

(10) Patent No.: US 6,802,953 B2
(45) Date of Patent: Oct. 12, 2004

(54) METHOD OF PRODUCING ZINC OXIDE THIN FILM, METHOD OF PRODUCING PHOTOVOLTAIC DEVICE AND METHOD OF PRODUCING SEMICONDUCTOR DEVICE

(75) Inventors: Masafumi Sano, Kyoto-fu (JP); Yuichi Sonoda, Nara (JP)

(73) Assignee: Canon Kabushiki Kaisha, Tokyo (JP)

( * ) Notice: Subject to any disclaimer, the term of this patent is extended or adjusted under 35 U.S.C. 154(b) by 266 days.

(21) Appl. No.: 10/046,903

(22) Filed: Jan. 17, 2002

(65) Prior Publication Data

US 2002/0100696 A1 Aug. 1, 2002

Related U.S. Application Data

(62) Division of application No. 09/074,699, filed on May 8, 1998, now Pat. No. 6,346,184.

(30) Foreign Application Priority Data

May 13, 1997 (JP) .............................................. 9-121921

(51) Int. Cl.⁷ .......................... C25D 11/00; C25D 5/10; C23C 28/00

(52) U.S. Cl. ........................ 205/333; 205/170; 205/199
(58) Field of Search .................................. 205/333, 170, 205/199; 136/256, 258; 438/584

(56) References Cited

U.S. PATENT DOCUMENTS 5,804,466 A * 9/1998 Arao et al. ................... 438/95

* cited by examiner

*Primary Examiner*—Edna Wong
(74) *Attorney, Agent, or Firm*—Fitzpatrick, Cella, Harper & Scinto

(57) ABSTRACT

The present invention provides a method of producing a zinc oxide thin film in which a current is passed between a conductive substrate immersed in an aqueous solution containing at least zinc ions, ammonium ions and zinc ammonia complex ions, and an electrode as an anode immersed in the aqueous solution to form a zinc oxide thin film on the conductive substrate. This method stabilizes formation of the zinc oxide thin film and improves adhesion between the thin film and the substrate.

15 Claims, 13 Drawing Sheets

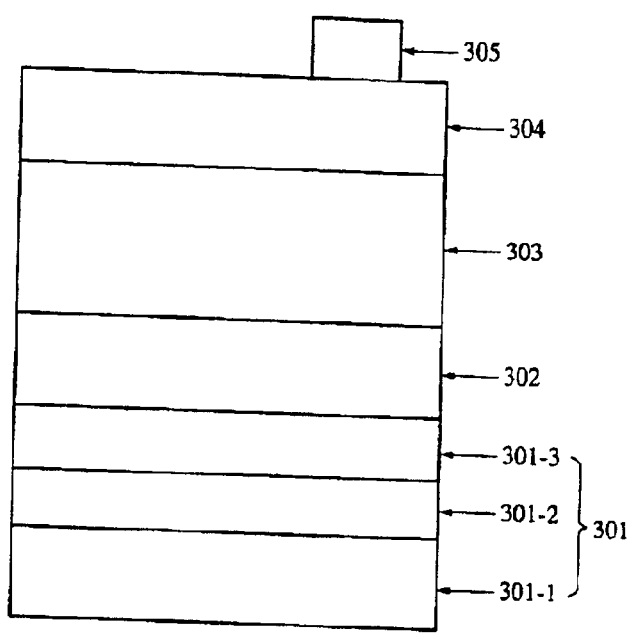
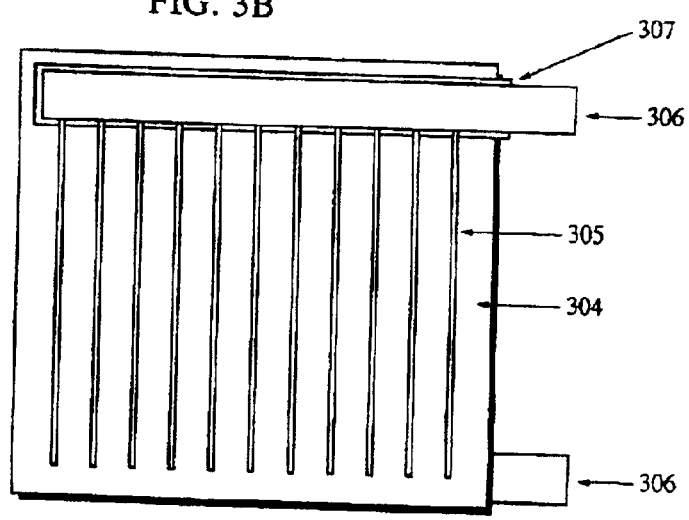

METHOD OF PRODUCING ZINC OXIDE THIN FILM, METHOD OF PRODUCING PHOTOVOLTAIC DEVICE AND METHOD OF PRODUCING SEMICONDUCTOR DEVICE

This application is a Division of application Ser. No. 09/074,699, filed May 8, 1998, now U.S. Pat. No. 6,346,184 B1.

BACKGROUND OF THE INVENTION

1. Field of the Invention

The present invention relates to a method of producing a zinc oxide thin film, a method of producing a photovoltaic device, and a method of producing a semiconductor device substrate.

2. Description of the Related Art

In a conventional photovoltaic device comprising amorphous silicon hydride, amorphous silicon germanium hydride, amorphous silicon carbide hydride, microcrystalline silicon or polycrystalline silicon, a reflecting layer formed on the back thereof is utilized for improving a collection efficient at long wavelengths. Such a reflecting layer preferably exhibits effective reflection properties at a wavelength near the band ends of a semiconductor material at which absorption is low, i.e., a wavelength of 800 to 1200 nm. Materials satisfying this condition include metals such as gold, silver, copper and aluminum.

Also, an uneven layer optically transparent in the predetermined wavelength range is generally provided as a light confinement layer between the metal layer and a semiconductor layer in order to improve a short-circuit current density Jsc by effectively utilizing reflected light.

Further, in order to prevent deterioration in properties due to a shunt path, a layer comprising a translucent material exhibiting conductivity, i.e., a transparent conductive layer, is provided between the metal layer and the semiconductor layer.

In general, these layers are deposited by a method such as vacuum deposition or sputtering, and show an improvement of 1 mA/cm$^2$ or more in short-circuit current density.

For example, in "Light Confinement Effect in a-SiGe Solar Cell on 29p-MF-2 Stainless Substrate", Abstracts of the 51st Science Lecture Meeting of the Applied Physical Society of Japan, p. 747, 1990, "a-SiC/a-Si/a-SiGe Multi-Bandgap Stacked Solar Cells With Band Gap Profiling"; Sannomiya et al., Technical Digest of the International PVSEC-5; Kyoto, Japan, p. 387, 1987, and "P-IA-15a-SiC/a-Si/a-SiGe Multi-Bandgap Stacked Solar Cells With Bandgap Profiling", Sannomiya et al., Technical Digest of the International PVSEC-5, Kyoto, Japan, p. 381, 1990, an improvement in short-circuit photoelectric current is achieved by a structure comprising a reflecting layer as a back layer composed of Ag, and a light confinement layer as an uneven front layer composed of zinc oxide.

Also, T. Tiedje, et al., Proc. 16th IEEE Photovoltaic Specialist Conf. (1982), p. 1423 and H. Deckman, et al., Proc. 16th IEEE Photovoltaic Specialist Conf. (1982); p. 1425 disclose a technique in which a back electrode is formed in a shape having unevenness (texture structure) of a size substantially the same as light wavelength, for scattering light. This lengthens the optical path in a semiconductor layer by scattering light at long wavelengths which is not absorbed by the semiconductor layer, and increases a short-circuit photoelectric current by improving the long wavelength sensitivity of a photovoltaic device, thereby improving the efficiency of photoelectric conversion.

Zinc oxide has higher resistance to a plasma than tin oxide and indium oxide, and is not reduced by hydrogen even in a plasma containing hydrogen. Therefore, in forming a semiconductor layer comprising amorphous silicon on a transparent conductive layer by a plasma CVD process, a zinc oxide thin film is positively used as the transparent conductive layer.

Japanese Patent Laid-Open No. 60-84888 (Energy Conversion Devices) discloses a technique in which a transparent conductive layer is interposed between a back electrode and a semiconductor layer to decrease a current flowing in a defect region of the semiconductor layer.

On the other hand, as seen in 24th IEEE First WCPEC; Dec. 5–9, 1994, p. 254 "EFFECTS OF Cd-FREE BUFFER LAYER FOR CuInSe$_2$ THIN-FILM SOLAR CELLS"; T. Nii, H. Takeshita, a technique using a zinc oxide thin film as a n-type window layer of copper-indium-selenium (Cu—In—Se$_2$: CIS), copper-(indium, gallium)-selenium (Cu—(InGa)—Se$_2$; SIGS), or the like has recently been disclosed.

As described above, a zinc oxide thin film is preferably used as the light confinement layer having a texture structure surface.

Although conventional known methods of producing a zinc oxide thin film include a vacuum deposition method, a sputtering method, an ion plating method, and a CVD method, all methods require an expensive vacuum apparatus, and an expensive vaporization source. Also the light confinement effect at wavelengths of 600 to 1000 nm is insufficient.

Other known methods include wet methods such as spray pyrolysis, a sol-gel method, a dipping method, and the like. However, in these wet methods, a substrate must be heated to about 300 to 800° C., and thus substrates which can be used are limited. Also, zinc hydroxide is contained in the thin film together with zinc oxide, and it is thus difficult to form a pure zinc oxide thin film.

As seen in Japanese Patent Laid-Open No.7-23775, Journal of Electrochemical Soc. Vol. 143, No. 3 "Electrolyte Optimization for Cathodic Growth of Zinc Oxide Films"; Masanobu Izaki, Takashi Omi, it has recently been reported that a counter electrode is immersed in an aqueous solution of zinc nitrate, and a current is passed to electrochemically deposit a transparent zinc oxide thin film.

Also a technique of forming a zinc oxide thin film by a liquid phase deposition method has been reported in "Formation of ZnO Film by Electrolysis in Aqueous Solution", (Autumn, 1995), 65th Applied Physics Society, p. 410.

In these methods, since an expensive vacuum apparatus and expensive target are unnecessary, the production cost of a zinc oxide thin film can significantly be decreased. Also a thin film can be deposited on a large substrate, and the methods are thus advantageous for large photovoltaic devices such as solar cells. However, the electrochemical deposition methods have the following problems:

(1) Particularly, an increase in current density or concentration of the solution causes the problem of easily producing abnormal growth of a needle-like, spherical, resin-like shape of the micron order or more on the deposited thin film. The use of such a zinc oxide thin film as a part of a photovoltaic device possibly causes the abnormal growth to induce a shunt path in the photovoltaic device.

(2) In the zinc oxide thin film formed by one of the above methods, unevenness easily occurs in the grain sizes of zinc oxide crystals, and particularly, the problem of unevenness occurs in the case of a large area.

(3) The zinc oxide thin film formed by one of the above methods has lower adhesion to a substrate than the vacuum deposition method using resistance heating, an electron beam or the like, the sputtering method, an ion plating method, and the CVD method.

Conventionally, only smooth thin films are formed by the electrochemical deposition methods, and a method of electrochemically depositing a zinc oxide thin film having unevenness for the light confinement effect has not been established yet.

SUMMARY OF THE INVENTION

Accordingly, it is an object of the present invention to stabilize formation of a zinc oxide thin film by electrodeposition, and provide a method of forming a zinc oxide thin film having excellent adhesion to a substrate. Particularly, a zinc oxide thin film suitable for application to a light confinement layer of a photovoltaic device is formed.

In order to achieve the object, the present invention provides the following methods of producing a zinc oxide thin film and photovoltaic devices formed by using the producing methods.

(1-1) A method of producing a zinc oxide thin film comprising passing a current between a conductive substrate immersed in an aqueous solution containing at least zinc ions, ammonium ions, and zinc ammonia complex ions, and an electrode as an anode immersed in the aqueous solution to form a zinc oxide thin film on the conductive substrate. This producing method is capable of electrochemically forming a zinc oxide layer and forming an uneven surface which can sufficiently exhibit light confinement or light scattering for light at wavelength of 600 to 1000 nm. Therefore, it is possible to produce a photovoltaic device having high quality and low power cost. Particularly, the production cost of the zinc oxide layer can be decreased to about $1/100$ of the sputtering method.

(1-2) In the method of producing a zinc oxide thin film, the conductive substrate comprises a transparent conductive layer deposited on a support. This producing method is capable of relatively easily and uniformly forming an initial film of zinc oxide, and efficiently forming the zinc oxide layer. Also, in a photovoltaic device, the zinc oxide film can be electrochemically formed on the conductive substrate by protecting a high-reflectance metal previously formed on the conductive substrate having an important function.

(1-3) In the method of producing a zinc oxide thin film, the hydrogen ion concentration (pH) of the aqueous solution for forming the zinc oxide thin film is controlled in the range of 8 to 12.5. This producing method is capable of relatively stably supplying complex ions such as the zinc ammonia complex ions or the like by keeping the solution for forming the zinc oxide thin film alkali, and efficiently forming the zinc oxide layer. Also, since the solution for forming the zinc oxide thin film is kept alkali, a wide range of substrates having no need for acid resistance can be used.

(1-4) In the method of producing a zinc oxide thin film, the hydrogen ion concentration pH of the aqueous solution near the uppermost surface where the zinc oxide thin film is formed is controlled in the range of 6 to 8. Since the hydrogen ion concentration pH of the aqueous solution near the uppermost surface where the zinc oxide thin film is formed is locally controlled in the range of 6 to 8, the dense zinc oxide thin film can be continuously formed. At the same time, the hydrogen ion concentration of the aqueous solution in the bulk region is preferably in the range described in (1-3).

(1-5) In the method of producing a zinc oxide thin film, the aqueous solution for forming a zinc oxide thin film contains a hydrocarbon. This producing method can significantly suppress abnormal growth in the zinc oxide layer, and thus further improve yield. The uniformity of the zinc oxide layer can further be improved.

(1-6) A method of producing a photovoltaic device comprising the step of forming the zinc oxide thin film. This forming step is capable of electrochemically forming the zinc oxide layer and forming an uneven surface which can sufficiently exhibit light confinement or light scattering for light at a wavelength of 600 to 1000 nm. Therefore, it is possible to produce a photovoltaic device having high quality and low power cost. Particularly, the production cost of the zinc oxide layer can be decreased to about $1/100$ of the sputtering method.

(2-1) A method of producing a zinc oxide thin film comprising passing a current between a conductive substrate immersed in an aqueous solution containing at least zinc ions, hydrogenzincate ions ($HZnO_2^-$) and zincate ions ($ZnO_2^{2-}$) and an electrode as a cathode immersed in the aqueous solution to form a zinc oxide thin film on the conductive substrate. This producing method is capable of electrochemically forming a zinc oxide layer and forming an uneven surface which can sufficiently exhibit light confinement or light scattering for light at wavelength of 600 to 1000 nm. Also, since the zinc oxide thin film is formed on the conductive substrate on the anode side, the zinc oxide thin film contains no zinc metal. Therefore, it is possible to produce a photovoltaic device having high quality and low power cost. Particularly, the production cost of the zinc oxide layer can be decreased to about $1/100$ of the sputtering method.

(2-2) In the method of producing a zinc oxide thin film, the conductive substrate comprises a transparent conductive layer deposited on a support. This producing method is capable of relatively easily and uniformly forming an initial film of zinc oxide, and efficiently forming the zinc oxide layer. Also, in a photovoltaic device, the zinc oxide film can be electrochemically formed on the conductive substrate by protecting a high-reflectance metal previously formed on the conductive substrate having an important function.

(2-3) In the method of producing a zinc oxide thin film, the hydrogen ion concentration (pH) of the aqueous solution for forming the zinc oxide thin film is controlled in the range of 8 to 12.5. This producing method is capable of relatively stably supplying ions such as the hydrogenzincate ions, zincate ions and the like by keeping the solution for forming the zinc oxide thin film alkali, and efficiently forming the zinc oxide layer. Also, since the solution for forming the zinc oxide thin film is kept alkali, a wide range of substrates having no need for acid resistance can be used.

(2-4) In the method of producing a zinc oxide thin film, the hydrogen ion concentration pH of the aqueous solution near the uppermost surface where the zinc oxide thin-film is formed is controlled in the range of 6 to 8. Since the hydrogen ion concentration pH of the aqueous solution near the uppermost surface where the zinc oxide thin film is formed is locally controlled in the range of 6 to 8, the dense zinc oxide thin film can be continuously formed. At the same time, the hydrogen ion concentration of the aqueous solution in the bulk region is preferably in the range described in (2-3).

(2-5) In the method of producing a zinc oxide thin film, the aqueous solution for forming a zinc oxide thin film contains a hydrocarbon. This producing method can significantly suppress abnormal growth in the zinc oxide layer, and thus further improve yield. The uniformity of the zinc oxide layer can further be improved.

(2-6) A method of producing a photovoltaic device comprising the step of forming the zinc oxide thin film. This forming step is capable of electrochemically forming the zinc oxide layer and forming an uneven surface which can sufficiently exhibit light confinement or light scattering for light at a wavelength of 600 to 1000 nm. Therefore, it is possible to produce a photovoltaic device having high quality and low power cost. Particularly, the production cost of the zinc oxide layer can be decreased to about 1/100 of the sputtering method.

(3-1) A method of producing a zinc oxide thin film comprising passing a current between a conductive substrate immersed in an aqueous solution containing at least carboxylic acid ions and zinc ions, and an electrode as an anode immersed in the aqueous solution to form a zinc oxide thin film on the conductive substrate. This producing method is capable of forming the zinc oxide film having excellent optical properties at low material cost without the need for a large-scale apparatus.

(3-2) In the method of producing a zinc oxide thin film, the aqueous solution is an aqueous solution of zinc acetate. This producing method is capable of forming the zinc oxide film having excellent optical properties at low material cost without the need for a large-scale apparatus.

(3-3) In the method of producing a zinc oxide thin film, the aqueous solution is an aqueous solution of a zinc formate. This producing method is capable of forming the zinc oxide film having excellent optical properties at low material cost without the need for a large-scale apparatus.

(3-4) In the method of producing a zinc oxide thin film, the conductive substrate comprises a transparent conductive layer deposited on a support. This producing method is capable of forming the zinc oxide thin film having less abnormal growth and excellent uniformity.

(3-5) In the method of producing a zinc oxide thin film, the hydrogen ion concentration pH of the aqueous solution for depositing the zinc oxide thin film is controlled in the range of 3.5 to 5.5. This producing method is capable of forming the zinc oxide thin film having less abnormal growth and excellent uniformity.

(3-6) A method of producing a photovoltaic device comprising the step of forming the zinc oxide thin film. This producing method is capable of stably forming the high-performance device at low cost.

Further objects, features and advantages of the present invention will become apparent from the following description of the preferred embodiments with reference to the attached drawings.

BRIEF DESCRIPTION OF THE DRAWINGS

FIG. 3A is a schematic sectional view showing an example of a photovoltaic device having a zinc oxide thin film of the present invention, and FIG. 3B is a top view of the same;

DESCRIPTION OF THE PREFERRED EMBODIMENTS

The method of producing a zinc oxide thin film of the present invention, and a photovoltaic device formed by using the producing method will be described in detail below with reference to the drawings.

Method of Forming Zinc Oxide Thin Film

Figure 1:
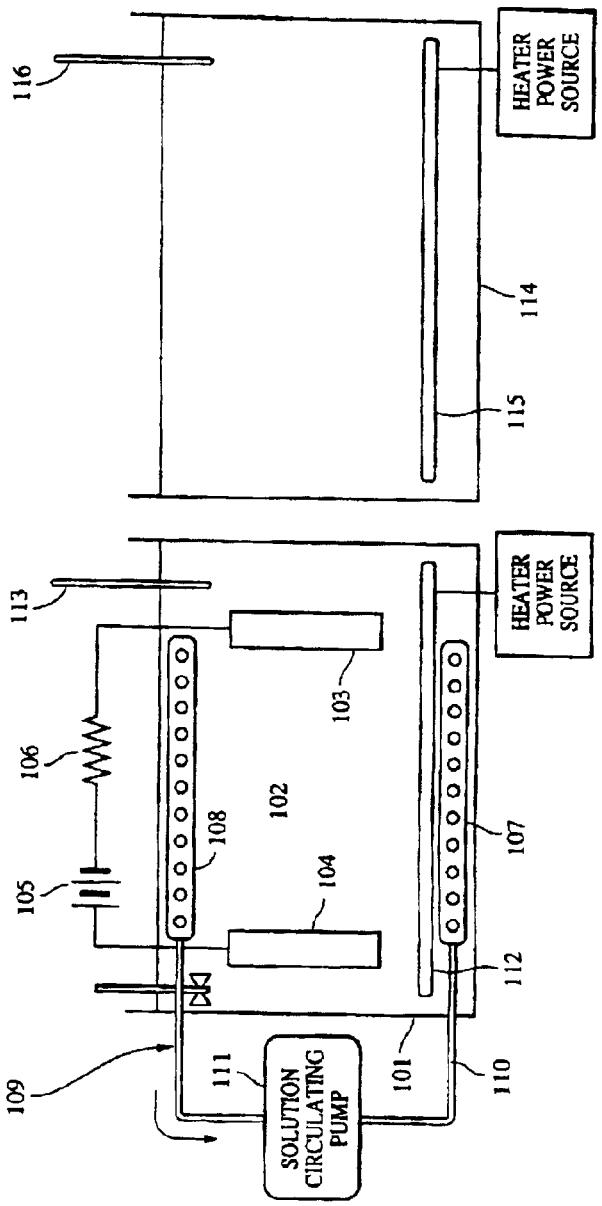
FIG. 1 is a schematic sectional view showing an example of apparatus for producing a zinc oxide thin film of the present invention.

FIG. 1 shows an example of apparatus for forming the zinc oxide film of the present invention. An aqueous solution 102 of the present invention is held in a corrosion-resistant vessel 101.

In FIG. 1, a conductive substrate 103 serves as a cathode, and a counter electrode 104 can be made of platinum, carbon, platinum-plated titanium, or the like other than zinc as a metal to be deposited in a liquid phase. In FIG. 1, the counter electrode 104 serves as an anode. Load resistance 106 and a power supply 105 are connected between the conductive substrate 103 serving as a cathode, and the counter electrode 104 serving as an anode so as to pass a substantially constant current.

The solution is stirred to decrease nonuniformity in formation of the thin film. In order to increase the rate of thin film formation to improve efficiency, a solution circulation system is used, which comprises an inlet bar 108 having a plurality of solution inlets, an injection bar 107 having a plurality of solution injection ports, a solution circulating pump 111, an intake solution pipe 109 connecting the solution inlet bar 108 and the solution circulating pump 111, and an injection solution pipe 110 connecting the solution injection bar 107 and the solution circulating pump 111. In small-scale apparatus, stirring means such as a magnetic stirrer or the like can be used in place of such a solution circulating system.

A heater 112 and a thermocouple 113 are used for controlling the temperature of the aqueous solution while monitoring the temperature. In order to obtain a desired zinc oxide thin film, the temperature of the aqueous solution is preferably 50° C. or higher.

Before the zinc oxide thin film is formed, the conductive substrate 103 may be previously immersed in a hot water bath 114 in order to heat the conductive substrate 103. Hot water whose temperature is controlled by using a heater 115 and a thermocouple 116 is contained in the hot water bath 114 so that the conductive substrate 103 can be heated.

The conductive substrate 103 is preferably formed by depositing a metal layer as a reflecting layer on a support. Particularly, aluminum has high reflectance for light at wavelengths of 600 to 1000 nm, and causes no electrochemical migration, and is thus a most promising metal for the metal layer of a photovoltaic device. However, since it is difficult to electrochemically grow (electroplate) zinc oxide directly on aluminum in an aqueous solution, in the use of aluminum for the metal layer, a transparent conductive thin layer is preferably provided on aluminum.

The transparent conductive layer must be transparent for light at wavelengths of 600 to 1000 nm, and have some conductivity. For example, the transparent conductive layer is made of tin oxide ($SnO_2$), indium oxide ($In_2O_3$), ITO ($SnO_2+In_2O_3$), zinc oxide (ZnO), indium zinc oxide, tin zinc oxide, or the like. These oxides can be deposited by the sputtering method, the CVD method, or the vacuum deposition method. The zinc oxide thin film can be formed on the transparent conductive layer by the method of the present invention. For light at wavelengths of 600 to 1000 nm, light confinement or light scattering is sufficiently achieved. Therefore, the photovoltaic device of the present invention exhibits high quality and low power cost.

Conditions for forming the zinc oxide thin film will be described for each of the aqueous solutions used. Since the formation conditions below depend upon the type, sectional shape and crystal state of the metal layer, the conditions cannot be determined collectively. However, generally, as the ion concentration increases, the grain size of zinc oxide crystals increases, and unevenness easily occurs in the surface. As the formation temperature decreases, the grain size of zinc oxide crystals increases.

Also, as the current density increases, unevenness less occurs in the surface. However, since the current density is roughly proportional to the formation rate, unevenness is preferably formed on the surface at a current density increased for decreasing the cost of the transparent conductive layer comprising zinc oxide.

A case is first described in which the aqueous solution 102 contains at least zinc ions, ammonium ions, and zinc ammonia complex ions (zinc ammine complex ions). In this case, as shown in FIG. 1, the conductive substrate 103 and the counter electrode 104 are used as a cathode and an anode, respectively.

As a supply source for zinc ions, excessive ammonium ions, and complex ions such as zinc ammonia ions, for example, an aqueous solution such as an ammonia aqueous solution of zinc hydroxide, an ammonia aqueous solution of zinc acetate, an ammonia aqueous solution of zinc oxalate, an ammonia aqueous solution of zinc oxide or the like is used. In this case, the concentration of zinc ammonia complex ions is preferably 0.001 to 3.0 mol/l. The hydrogen ion exponent (pH) of the aqueous solution is preferably controlled in the range of pH 8 to pH 12.5. The temperature is preferably 50° C. or higher. In addition, the current density on the surface of the conductive substrate is preferably 0.1 to 100 $mA/cm^2$.

Next, a case is described in which the aqueous solution 102 contains zinc ions, hydrogenzincate ions, and zincate ions. In this case, in FIG. 1, the power source 105 is connected so that the conductive substrate 103 and the counter electrode 104 serve as an anode and a cathode, respectively.

Where excessive ammonia aqueous solution is added to an aqueous solution containing zinc ions to form a supply source for ions such as zinc ions, hydrogenzincate ions, zincate ions, and the like, for example, an aqueous solution such as an ammonia aqueous solution of zinc hydroxide, an ammonia aqueous solution of zinc acetate, an ammonia aqueous solution of zinc oxalate, an ammonia aqueous solution of zinc oxide, or the like is used. The concentration of ions such as hydrogenzincate ions, zincate ions and the like is preferably 0.01 to 3.0 mol/l. The hydrogen ion exponent (pH) of the aqueous solution is preferably controlled in the range of pH 8 to pH 12.5. The temperature is preferably 50° C. or higher. In addition, the current density on the surface of the conductive substrate is preferably 0.1 to 100 mA/ $cm^2$.

To each of the above two types of aqueous solutions is preferably added as an additive a hydrocarbon, for example, 1 to 300 g/l of sucrose or 0.001 to 10 g/l of dextrin. Although it is advantageous from the industrial viewpoint to increase the current density, in formation of the zinc oxide thin film at a current density increased to 5 $mA/cm^2$ or more, abnormal growth of an erect plate-like shape of 10 $\mu$m or more significantly occurs. Such abnormal growth of an erect plate-like shape causes local thinning of the semiconductor layer formed in a position where the abnormal growths occur, and excessive leakage current occurs, thereby causing malfunction in the device.

The addition of a hydrocarbon to the aqueous solution is capable of suppress abnormal growth of a crystal. As the hydrocarbon, for example, a monosaccharide such as glucose, fructose, or the like; a disaccharide such as maltose, sucrose, or the like; or a polysaccharide such as dextrin, starch, or the like can be used. In combination of at least two of these hydrocarbons to make use of the above advantages, a good zinc oxide thin film can be formed.

In order to obtain a zinc oxide thin film having no abnormal growth and excellent uniformity and adhesion, the amount of the hydrocarbon added to the aqueous solution is preferably in the range of 0.001 to 300 g/l, more preferably in the range of 0.005 to 100 g/l, and most preferably in the range of 0.01 to 60 g/l.

Finally, a case in which the aqueous solution 102 contains at least carboxylic acid ions and zinc ions is described. In this case, as shown in FIG. 1, the conductive substrate 103 and the counter electrode 104 are used as a cathode and an anode, respectively.

As the aqueous solution, for example, an aqueous solution containing carboxylic acid ions and zinc ions originating from zinc acetate or zinc formate can be used. The concentration of carboxylic acid ions is preferably 0.002 to 2.0 mol/l, more preferably 0.05 to 1.0 mol/l, and most preferably 0.025 to 0.3 mol/l. The applied current is preferably 0.1 to 100 mA/cm$^2$, more preferably 1 to 30 mA/cm$^2$ and most preferably 3 to 16 mA/cm$^2$. The solution temperature is preferably 50° C. or higher. The hydrogen ion exponent (pH) of the aqueous solution is preferably controlled in the range of pH 3.5 to pH 5.5.

Continuous Formation Apparatus

Figure 2:
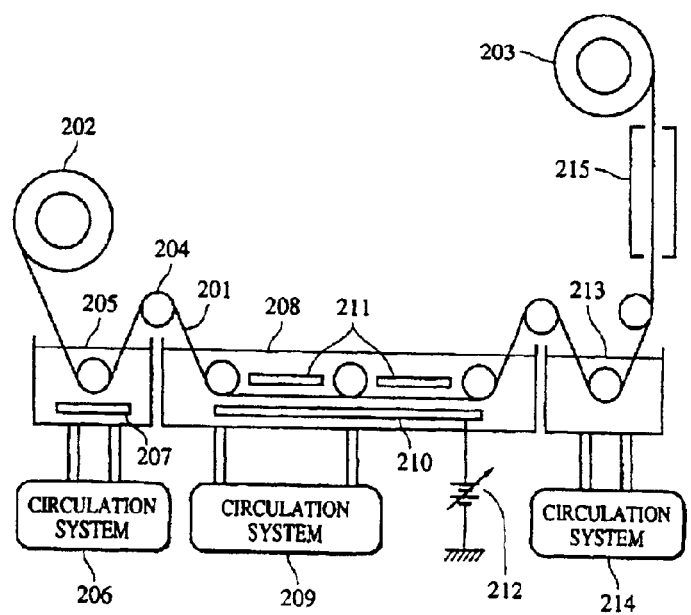
FIG. 2 is a schematic sectional view showing an example of apparatus for continuously producing a zinc oxide thin film of the present invention.

FIG. 2 shows an apparatus capable of continuously forming a zinc oxide thin film on the surface of a long sheet-shaped conductive substrate 201 having flexibility in an aqueous solution.

To the back of the surface of the conductive substrate 201 is applied an insulation tape (not shown in the drawing) for preventing deposition of the zinc oxide thin film. The conductive substrate 201 is wound in a roll on a feed roll 202, and rewound on a take-up roll 203 for rewinding the conductive substrate 201 through many transfer rolls 204.

In order to prevent plastic deformation of the substrate, the diameter of each of the rolls must be determined in accordance with the material of the conductive substrate 201.

The conductive substrate 201 is heated in a hot water tank 205 with a circulation system 206 containing a filter for removing dust particles and connected thereto, and a heater 207 is provided in the hot water tank 205.

The zinc oxide thin film is formed in a liquid phase deposition tank 208 to which a circulation system 209 containing a filter for removing dust particles is connected, with a zinc electrode 210 and a heater 211 provided in the liquid phase deposition tank 208. A constant current power source 212 is provided outside the liquid phase deposition tank 208, and connected to the zinc electrode 210. The circulation system 209 comprises a system for monitoring the solution concentration and on occasion adding a solution.

To a washing tank 213 is connected a circulation system 214 containing a filter for removing dust particles. The conductive substrate 201 is dried with hot air in a drying chamber 215.

This apparatus is capable of forming the zinc oxide thin film at low cost.

Application to Photovoltaic Device

FIG. 3A is a schematic sectional view showing an example of a photovoltaic device to which the zinc oxide thin film formed by the method of the present invention was applied. The photovoltaic device comprises a support 301-1, a metal layer 301-2, a transparent conductive layer 301-3, a zinc oxide layer 302 formed by the method of the present invention, a semiconductor layer 303, a transparent conductive layer 304, and a collecting electrode 305. The support 301-1, the metal layer 301-2 and the transparent conductive layer 301-3 constitutes a conductive substrate 301 according to the present invention.

Sunlight is incident on the photovoltaic device from the transparent conductive layer 304 side. Light at short wavelengths of 500 nm or less is mostly absorbed by the semiconductor layer 303. On the other hand, light at long wavelengths of about 700 nm or more, which is longer than the band absorption ends, is partially transmitted through the semiconductor layer 303, passes through the zinc oxide layer 302 as a transmitting layer, is reflected by the metal layer 301-2 or the support 301-1, again passes through the zinc oxide layer 302 as a transmitting layer, and is then partially or mostly absorbed by the semiconductor layer 303.

If unevenness is formed in the support 301-1 and/or the metal layer 301-2 and/or the zinc oxide layer 302 as a transmitting layer and/or the semiconductor layer 303 so as to sufficiently bend the optical path, the optical path of light transmitted through the semiconductor layer 303 is lengthened due to inclination of the optical path, and thus an increase in absorption is expected. Although the increase in absorption due to lengthening of the optical path is negligibly small in a layer transparent for light, the increase is exponential for light in the region where some absorption is present, i.e., for light at wavelengths near the absorption edged of a material. Since the zinc oxide layer 302 as a transparent layer is transparent for external light ranging from visible light to infrared light, light at wavelengths of 600 to 1200 nm is absorbed by the semiconductor layer 303.

FIG. 3B is a schematic drawing of the photovoltaic device as viewed from the incident side, in which a plurality of collecting electrodes 305 are arranged so as not to cross the surface of the device. The collecting electrodes 305 are arranged in a comb-like form as viewed from the incident side, ends thereof being electrically connected to a bus bar 306. The bus bar 306 is formed on the collecting electrodes 305 and made of a metallic material having high conductivity, such as a Cu plate or the like. The bus bar 306 is adhered to the transparent conductive layer 304 with an insulating double side tape arranged therebetween.

Figure 4:
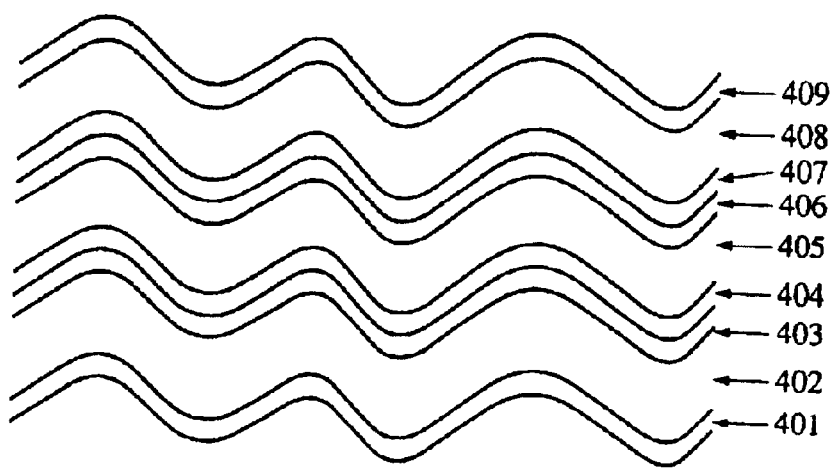
FIG. 4 is a schematic sectional view showing an example of the configuration of a semiconductor layer.

FIG. 4 shows an example of the internal structure of the semiconductor layer 303 made of a hydrogen-containing non-single crystal silicon material and having at least one p-i-n junction therein. This example has three p-i-n junctions.

As shown in FIG. 4, the semiconductor layer comprises layers laminated in turn and made of hydrogen-containing non-single crystal silicon materials. Doped layers-401, 403, 404, 406, 407 and 409 are conductive layers exhibiting p-type or n-type conduction. The first doped layer 401, the third doped layer 404 and the fifth doped layer 407 exhibit the same conductivity, and the second, fourth and sixth doped layers 403, 406 and 409 exhibit conductivity different from the above doped layers 401, 404 and 407. First, second and third i-type semiconductor layers (i layers) 402, 405 and 408 exhibit intrinsic conductivity. From the viewpoint of efficiency of light collection, the following condition is preferably satisfied:

Band gap of the first i layer 402< band gap of the second i layer 405< band gap of the third i layer 408. As each of the doped layers, a n-type semiconductor layer (n layer) or a p-type semiconductor layer (p layer) can be used.

Figure 5A:
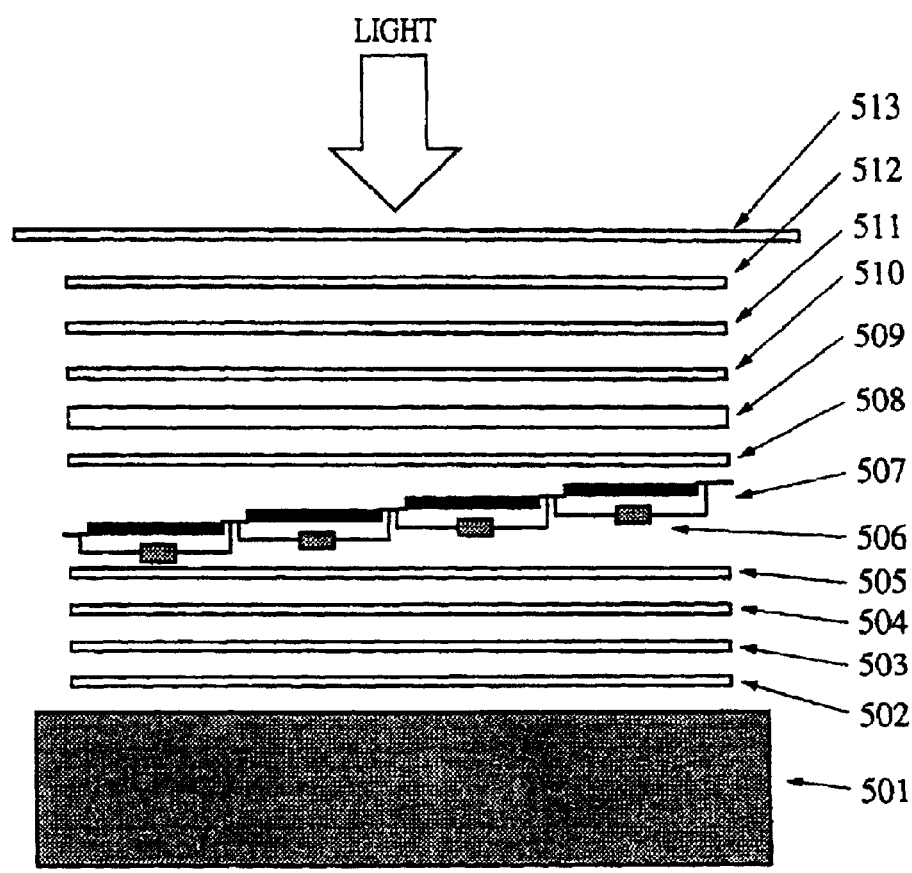
FIG. 5A is a schematic exploded sectional view showing an example of the configuration of a photovoltaic device module.
Figure 5B:
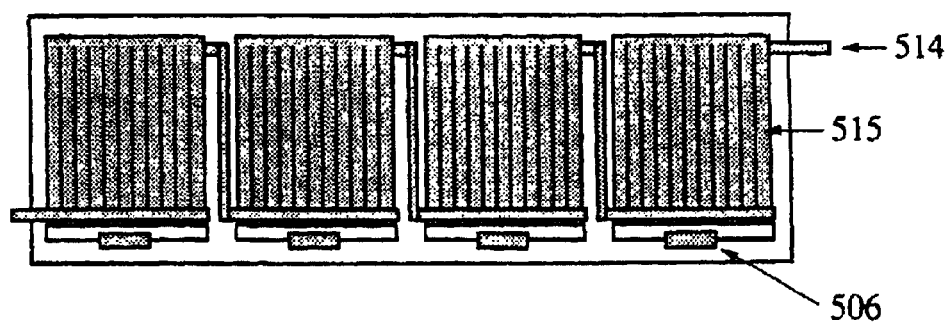
FIG. 5B is a top view of the device portion thereof.

FIG. 5A is an exploded sectional view showing a photovoltaic device module in accordance with an embodiment of the present invention, and FIG. 5B is a plan view showing a portion including the photovoltaic devices 507 and the bypass diodes 506 shown in FIG. 5A. As shown in FIGS. 5A and B, a plurality of the photovoltaic devices 507 are arranged in series, and the bypass diodes 506 are respectively connected to the photovoltaic device 507 in parallel so that even when one of the photovoltaic devices shadows, the total voltage of the other photovoltaic devices is not applied to the photovoltaic device shadowing.

In the photovoltaic device module of the present invention, after each of the members is arranged as shown in FIGS. 5A and 5B, the members are sealed by a fluororesin 523 and a supporting substrate 501 to suppress entrance of water vapor.

Each of the collecting electrodes 515 used in the photovoltaic device module comprises a silver cladding layer and a carbon layer containing an acrylic resin as a binder, both of which are formed around a fine copper wire, the collecting electrodes 515 being fused to the transparent conductive layer by heating. The silver cladding layer has the function to decrease contact resistance with the copper wire. The carbon layer containing an acrylic resin as a binder has the function to maintain adhesion to the transparent conductive layer, and the function to decrease contact resistance with the silver cladding layer. The carbon layer also has the function to prevent diffusion of the silver contained in the silver cladding layer into the semiconductor layer.

Each of the portions will be described in detail below.

(Support 301-1)

The support used in the present invention may comprise a single material or one or a plurality of thin films formed on the support. The support may be electrically insulative as long as a surface thereof has conductivity.

Examples of conductive materials include metals such as Cu, Ni, Cr, Fe, Al, Cr, Mo, Nb, Ta, V, Ti, Rh, and the like; and alloys thereof. These materials may be used singly as the support. Particularly, from the viewpoints of workability, strength, chemical stability, cost, etc., stainless steel and Fe are preferred.

Insulating materials for the support include synthetic resins such as polyester, polyethylene, polycarbonate, cellulose acetate, polypropylene, polyvinyl chloride, polyvinylidene chloride, polystyrene, polyamide, and the like; glass; ceramics; and the like. A thin film made of one of the above conductive materials is formed on at least one surface of the support.

In the use of one of the above materials for the support, the material is preferably formed in a sheet shape or a roll shape formed by rolling a band on a cylinder.

The thin film is preferably formed on the support by vacuum deposition, sputtering, screen printing, dipping, plasma CVD, electroplating, electroless plating, or the like. The smoothness of the support surface is preferably a center line average surface roughness Ra of 3.0 $\mu$m or less. In order to form unevenness, the surface of the support may be appropriately etched with an acid solution of $HNO_3$, HF, HCl, $H_2SO_4$, or the like.

Where flexibility is required, the support can be made as thin as possible in a range in which the function as the support can sufficiently be exhibited. However, from the viewpoints of production, handling and mechanical strength of the support, the thickness is generally 10 $\mu$m or more.

In order to prevent peeling of the metal layer 301-2 and the transparent conductive layer 301-3, the surface of the support is preferably washed with a surfactant or an organic substance.

(Metal Layer 301-2 and Transparent Conductive Layer 301-3)

Although the metal layer is not essential, for the support made of a stainless steel or copper plate having low reflectance, or the support made of a material with low conductivity, such as glass, ceramic or resin, the metal layer made of silver, copper, gold or aluminum having high reflectance is provided on the support by sputtering or vaporization.

In the use of aluminum for the metal layer, in order to prevent dissolution of aluminum in the aqueous solution, a thin transparent conductive layer is formed on the metal layer.

The metal layer used in the present invention may comprise a single layer or multilayers.

In either case, the total thickness is preferably 0.01 to 0.5 $\mu$m.

As the method of producing the metal layer, the vacuum deposition method, the sputtering method or the electrochemical deposition method (plating method) using an aqueous solution is preferably used. The surface of the metal layer may be either smooth or uneven.

In formation of the metal layer by sputtering, the support 301-1 is made uneven by heating to a temperature of 150° C. or higher-to improve adhesion between the metal layer and the support 301-1.

(Semiconductor Layer 303)

This layer is an important layer which determines photoelectric properties of the photovoltaic device, such as the efficiency of photoelectric conversion, release voltage, the short-circuit photocurrent, etc. The semiconductor layer of the present invention has at least one p-i-n junction, and comprises a non-single crystal silicon material. In some cases, a p-i-n junction may be formed on a pn junction.

The non-single crystal silicon material mainly has an amorphous (a-), microcrystalline ($\mu$c) or polycrystalline (poly) structure. Examples of such materials include a-Si, a-SiGa, a-SiSn, a-SiC, a-SiO, a-SiN, $\mu$c-Si, uc-SiC, and poly-Si. In order to make these materials the p type, an element such as B, Al or the like is added, and in order to make the n-type, an element such as P, As, Sb, or the like is added. For materials having the amorphous or microcrystalline structure, defects such as unpaired electrons must be compensated for by adding an element such as H, F, Cl, or the like. This can significantly improve the curve factor (fill factor) of the photovoltaic device.

The order of the layers may be the n layer, the i layer and the P layer, or conversely the p layer, the i layer and n layer from the support side. In the use of a pn junction, n-p/n-i-p or p-n/p-i-n from the support side may be used. The semiconductor layer may have one p-i-n junction, but preferably have at least two p-i-n junctions in order to suppress photodeterioration of the photovoltaic device (the phenomenon that the fill factor and release voltage are decreased by irradiation of strong light, thereby deteriorating the efficiency of photoelectric conversion with the passage of time).

The example of the semiconductor layer shown in FIG. 4 has three p-i-n junctions, and preferably comprises the first i layer 402 made of a-SiGe:H, the second i layer 405 made of a-SiGe:H, and the third i layer 408 made of a-Si:H. Each of these i layers may comprise a single layer, or a laminated layer such as a-Si/a-s, a-Si/a-SiGe/a-Si, or the like. Also, in order to make the i layers more intrinsic, an element such as B or the like may be added. In formation of a pn junction, it is preferable to add the above elements for making the p type and n type to poly-Si or $\mu$c-Si. These materials generally do not cause the above photodeterioration, and are thus preferable for outdoor use for a long period of time. However, the absorption coefficient for visible light is lower than amorphous materials, and thus a thickness of 0.5$\mu$ a or more is required.

Each of the n and p layers is preferably made of a material exhibiting as the lowest possible absorption, and a-Si, a-SiC, a-SiO, a-SiN, $\mu$c-Si, $\mu$c-SiC, and poly-Si are generally used.

In order to form the p-i-n junction using a non-single crystal silicon material such as a-Si, a-SiO, a-SiN, $\mu$c-Si or $\mu$c-SiC, a plasma CVD method is generally used. Particularly, a microwave plasma CVD method having a high deposition rate is preferably used for forming the i layers. In order to form poly-Si on the substrate, a-Si may be formed by the plasma CVD method, the sputtering method, or the like, and then made polycrystalline by irradiating a laser or applying radio-frequency-power. In layer formation using a RF plasma CVD method, raw material gases may be diluted with Ar, $H_2$ or He 1 to about 100 times. In the use of a non-single crystal silicon material having the microcrystalline structure, raw material gases may be diluted with Ar, $H_2$ or He about 10 to 100 times.

(Transparent Conductive Layer 304)

This layer is an important layer for efficiently guiding light to the semiconductor layer 303 and guiding a photocurrent to the collecting electrodes without a loss. Therefore, it is necessary to further decrease light absorption, control the thickness with high reproducibility for improving an antireflecting effect, and decrease resistivity as much as possible. Suitable materials include $SnO_2$, $In_2O_3$, ITO, and the like. It is also possible to improve the antireflecting effect by laminating $MgF_2$, $TiO_2$, or the like on the above layer.

For example, in the use of ITO for the transparent conductive layer, the thickness is preferably about 700 to 800 angstroms so that visible light can effectively be guided to the semiconductor layer.

In order to form the transparent conductive layer made of one of the above materials on the semiconductor layer 303, the vacuum deposition or sputtering method is generally used. In general, by forming the conductive layer at a temperature of about 100 to 300° C., the transparent conductive layer with low resistivity can be obtained. However, from the industrial viewpoint, the sputtering method permitting formation on a large area and an increase in deposition rate is preferable. Further, from the viewpoint of cost, the reactive sputtering method of forming a film using a target of In, Sn, or InSn (for example, Sn: 5 wt %) while introducing Ar and $O_2$ into a deposition chamber is preferable.

(Collecting Electrode 305)

In order to attain a low loss of the photocurrent and effectively guide light to the semiconductor layer 303, the collecting electrodes 305 preferably have a comb-like shape as viewed from the incident side, as shown in FIG. 3B. As a material, materials having high conductivity, i.e., Au, Ag, Cu, Al and the like, are generally used. The collecting electrodes of the present invention may be made of a single layer of one of these metals or a plurality of layers of these metals and other metals.

However, like the metal layer 301-2, the use of Au, Ag, or Cu causing migration has the need to prevent migration. Specifically, the collecting electrodes 305 are preferably formed by coating carbon paste comprising an urethane resin dissolved as a binder in cyclohexane on wires of one of the above metals, placing the wires on the transparent conductive layer 304, and then drying. In this method, cyclohexane is evaporated by drying to fuse the core wires to the transparent conductive layer 304, and thus the collecting electrodes having very low contact resistance can be obtained. Alternatively, the collecting electrodes may be formed by coating carbon paste in the electrode shape by screen printing, printing the metal on the carbon paste by screen printing, and then drying.

In the use of Al as a metal, a single layer or multilayers with another metal, such as Cr/Al/Cr or the like, may be formed by vacuum deposition using a mask for covering the deposition surface, or sputtering. In order to improve chemical stability, about 0.1 to 10% of Ti, Mn, Si, Mo or the like may be added. Also, the bus bar 306 comprising a copper plate shown in FIG. 3B may be simultaneously fused to a portion with a high current density. In the use of the conductive support 301-1, the same bus bar 306 comprising a copper plate may be fused to the back of the support 301-1.

Although the method of producing the zinc oxide thin film of the present invention, and a solar cell as a photovoltaic device using the zinc oxide film are described in detail below with reference to examples, the present invention is not limited to these examples.

EXAMPLE 1

The zinc oxide thin film was produced by using the apparatus shown in FIG. 1.

As the conductive substrate 103 on the cathode side, a substrate of stainless 430BA having a thickness of 0.15 mm, and comprising Ag deposited to 300 nm by sputtering, with the back covered with an insulating tape (not shown in the drawing), was used. As the counter electrode 104 on the anode side, 4-N zinc having a thickness of 1 mm was used. The aqueous solution 102 was an aqueous solution of 0.03 mol/l zinc hydroxide in 10% ammonia at 65° C. and a pH of 10.3. The applied current was 1.0 $mA/cm^2$ (0.1 $A/dm^2$).

The thus-obtained electrodeposited film was examined by X-ray diffraction, and the deposition rate and reflectance at a wavelength of 800 nm were measured from optical characteristics. The results are shown in Table 1.

TABLE 1

| Type of electrodeposited film | Zinc oxide |
|---|---|
| Deposition rate (μm/h) | 2 |
| Reflectance (%) | 90 |

The above results indicate that an excellent zinc oxide thin film can be obtained by the method of producing a zinc oxide thin film of the present invention.

EXAMPLE 2

Electrodeposition was carried out by the same method as Example 1 except that as the conductive substrate 103, a substrate of stainless 430BA having a thickness of 0.15 mm, and comprising Ag deposited to 100 mn by sputtering and zinc oxide deposited to 100 nm on Ag by sputtering, with the back covered with an insulating tape (not shown in the drawing), was used.

The thus-obtained electrodeposited film was examined by X-ray diffraction, and the deposition rate and reflectance at a wavelength of 800 nm were measured from optical characteristics. The results are shown in Table 2.

TABLE 2

| Type of electrodeposited film | Zinc oxide |
|---|---|
| Deposition rate (μm/h) | 3 |
| Reflectance (%) | 72 |

The above results indicate that an excellent zinc oxide thin film can be obtained by the method of producing a zinc oxide thin film of the present invention.

EXAMPLE 3

The solar cell shown in FIG. 3 and having a semiconductor layer having three p-i-n junctions, as shown in FIG. 4, was produced.

Specifically, the solar cell comprised the support 301-1 (conductive substrate of stainless steel SUS430, 10×10 $cm^2$, thickness 0.2 mm), the metal layer 301-2 (Al), the transparent conductive layer 301-3 (zinc oxide thin film), the zinc oxide layer 302, the semiconductor layer 303, the transparent conductive layer 304, and the collecting electrodes 305 (Cu wire/Ag/C).

The metal layer 301-2 and the transparent conductive layer 301-3 were formed by the general vacuum deposition or sputtering method.

The zinc oxide layer 302 was formed by the same method as Example 1 except that 3 g/l of sucrose was added to the aqueous solution.

The semiconductor layer 303 was formed under the conditions shown in Table 3.

TABLE 3

| Semiconductor layer | Forming method | Deposition temperature (° C.) | Thickness ($\mu$m) |
|---|---|---|---|
| First doped layer n-type a-Si:H:P | RFCVD | 300 | 0.015 |
| First i layer a-SiGe:H | Microwave CVD | 280 | 0.1 |
| Second doped layer p type $\mu$c-Si:H:B | RFCVD | 240 | 0.01 |
| Third doped layer n-type a-Si:H:P | RFCVD | 240 | 0.01 |
| Second i layer a-SiGe:H | Microwave CVD | 270 | 0.07 |
| Fourth doped layer p-type $\mu$c-Si:H:B | RFCVD | 240 | 0.01 |
| Fifth doped layer n-type a-Si:H:P | RFCVD | 230 | 0.01 |
| Third i layer a-Si:H | RFCVD | 200 | 0.1 |
| Sixth doped layer p-type $\mu$c-Si:H:B | RFCVD | 165 | 0.01 |

The transparent conductive layer 304 was formed by the sputtering method.

As shown in FIG. 3B, on one side of the substrate on which the layers of up to the transparent conductive layer 304 were formed was applied the commercial insulating double side tape 307, and a Cu plate as the bus bar 306 was placed on the double side tape 307. The collecting electrodes comprising Cu wire/Ag/C were formed and then fused to the conductive layer 304 by heating and drying. Ten solar cells were produced (Examples 3-1 to 3-10).

For comparison, ten solar cells (Comparative Examples 3-1 to 3-10) were produced by the same method except that the zinc oxide layer 302 was formed by the general sputtering method without forming the transparent conductive layer 301-3.

First, the initial characteristics (photoconductive characteristics, short-circuit current) of these solar cells were measured.

As a result of measurement of the efficiency of photoelectric conversion and short-circuit photocurrent using a solar simulator (AM 1.5, 100 mW/cm$^2$, surface temperature 25° C.), on average, the efficiency of photoelectric conversion and short-circuit photocurrent of the photovoltaic devices (Examples 3-1 to 3-10) produced by using the method of forming a zinc oxide thin film of the present invention were 1.15 times and 1.16 times, respectively, as high as the comparative examples. The increase in the short-circuit photocurrent indicates that desired unevenness was formed.

Then, as an acceleration test, a HH test (high-temperature high-humidity test) was performed. A solar cell was placed in an environmental test box and allowed to stand at a temperature of 84° C. and a humidity of 85% for 180 hours. The solar cell was then allowed in the environmental test box in which the temperature was set to 25° C., and humidity was set to 50% for 1 hour, and then removed. As a result of measurement of the efficiency of photoelectric conversion and short-circuit photocurrent, the efficiency of photoelectric conversion and short-circuit photocurrent of the photovoltaic devices (Examples 3-1 to 3-10) produced by using the method of forming a zinc oxide thin film of the present invention were 1.09 times and 1.11 times, respectively, as high as the comparative examples.

EXAMPLE 4

Figure 6:
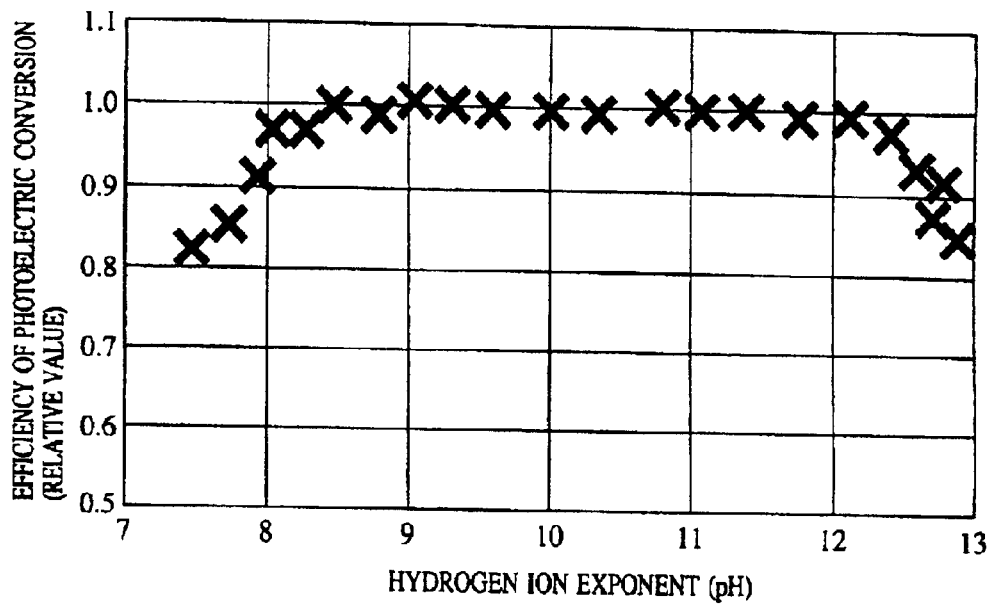
FIG. 6 is a graph showing the relation between the hydrogen ion exponent of an aqueous solution and efficiency of photoelectric conversion.

Solar cells were formed by the same method as Example 3 except that the pH of the aqueous solution was changed to 7.5 to 13 by using a pH buffer and a strong alkali aqueous solution. As shown in FIG. 6, the efficiency of photoelectric conversion was the maximum in the pH range of 8 to 12.5.

EXAMPLE 5

Figure 7:
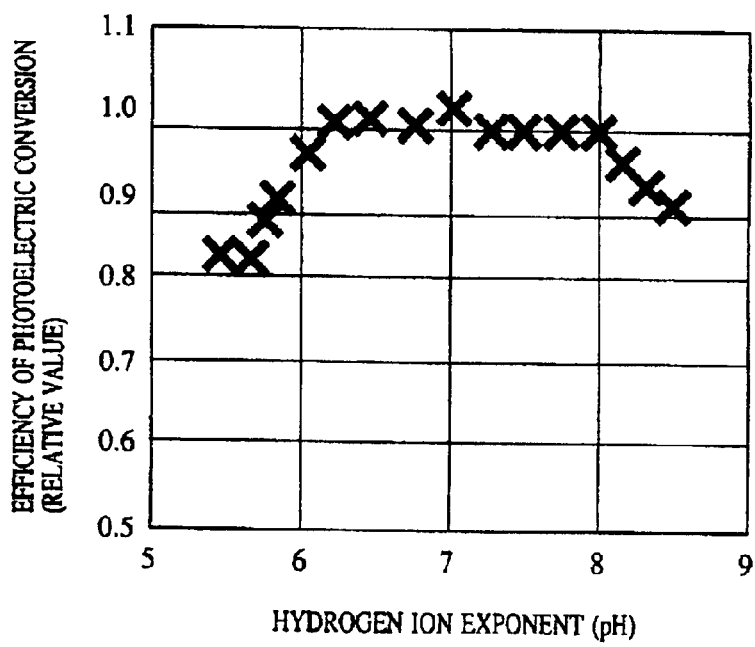
FIG. 7 is a graph showing the relation between the hydrogen ion exponent of an aqueous solution near the uppermost surface where a zinc oxide thin film is formed and efficiency of photoelectric conversion.

Solar cells were formed by the same method as Example 3 except that the hydrogen ion exponent of the aqueous solution near the uppermost surface where the zinc oxide thin film was formed was changed to pH 5.5 to 8.5 by using a 10% ammonia aqueous solution of 0.02 mol/l zinc oxalate at pH 10.3, weak acid and weak alkali pH buffers while changing the applied current. As shown in FIG. 7, the efficiency of photoelectric conversion was the maximum in the pH range of 6 to 8.

EXAMPLE 6

Figure 8:
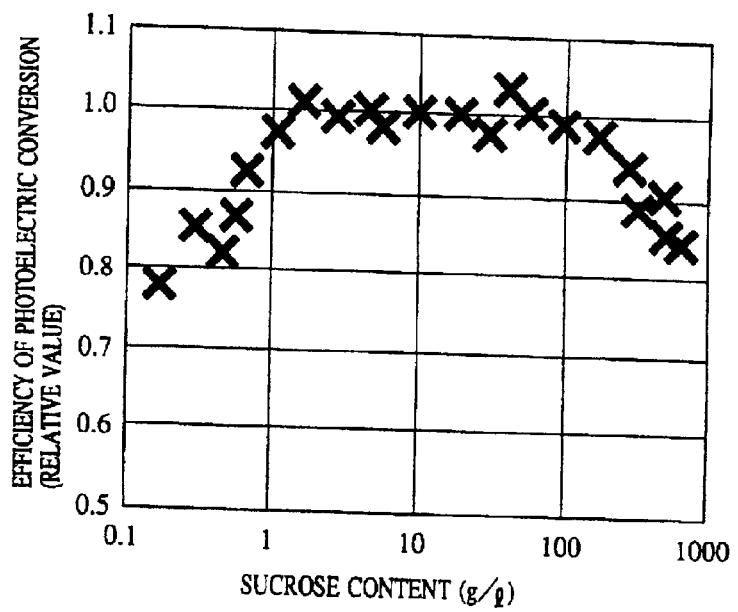
FIG. 8 is a graph showing the relation between the sucrose content of an aqueous solution and efficiency of photoelectric conversion.

Solar cells were formed by the same method as Example 3 except that the sucrose content was changed from 0 to 800 g/l. As shown in FIG. 8, the efficiency of photoelectric conversion was the maximum in the range of sucrose contents of 1 to 300 g/l.

SEM observation of a section of the transparent conductive layer showed significant abnormal growth of an erect plate-like shape at a sucrose content of 1 g/l or less. Therefore, the leakage current was decreased, thereby deteriorating the efficiency of photoelectric conversion. On the other hand, at a sucrose content of over 300 g/l, the shape was excessively flat, and thus insufficient for light confinement and light scattering, thereby deteriorating the efficiency of photoelectric conversion.

EXAMPLE 7

Figure 9:
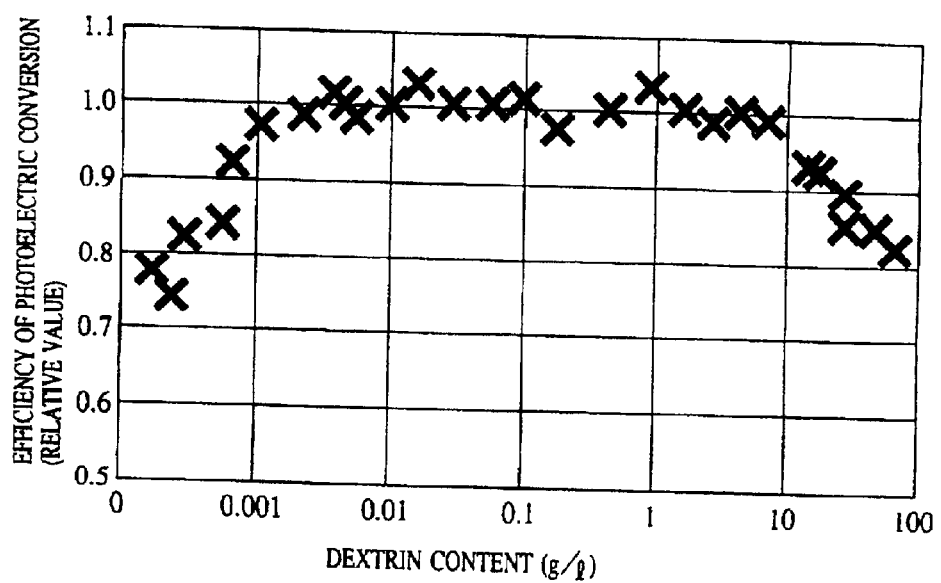
FIG. 9 is a graph showing the relation between the dextrin content of an aqueous solution and efficiency of photoelectric conversion.

Solar cells were formed by the same method as Example 3 except that the dextrin content was changed from 0 to 100 g/l. As shown in FIG. 9, the efficiency of photoelectric conversion was the maximum in the range of sucrose contents of 0.001 to 10 g/l.

SEM observation of a section of the transparent conductive layer showed significant abnormal growth of an erect plate-like shape at a dextrin content of 0.001 g/l or less. Therefore, the leakage current was decreased, thereby deteriorating the efficiency of photoelectric conversion. On the other hand, at a sucrose content of over 10 g/l, the shape was excessively flat, and thus insufficient for light confinement and light scattering, thereby deteriorating the efficiency of photoelectric conversion.

EXAMPLE 8

Figure 10:
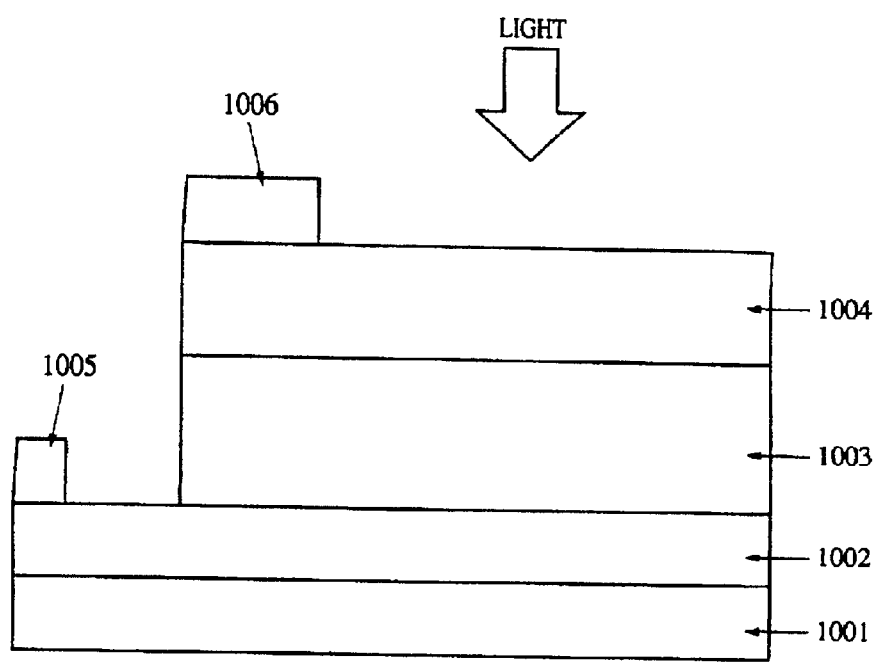
FIG. 10 is a schematic sectional view showing an example in which a zinc oxide thin film of the present invention was applied to a CIGS type photovoltaic device.

The CIGS type solar cell shown in FIG. 10 was produced.

Specifically, a blue glass plate on which Mo was deposited to 2 $\mu$m by sputtering was used as the substrate. On the substrate was formed a Cu—In—Ga—Se mixed crystal precursor at the substrate temperature of 220° C. by the simultaneous vaporization method. Then, the substrate was kept in a selenium atmosphere at 500° C. for 80 minutes to form a CIGS thin film. The substrate was placed in the aqueous solution for forming a zinc oxide thin film of the present invention, and the zinc oxide thin film of the present invention was electrolytically deposited on the surface of the CIGS thin film under irradiation of strong light in the same manner as Example 1. Characteristics of the obtained CIGS type solar cell were measured by the same method as Example 3. As a result, it was found that the solar cell has excellent initial efficiency of photoelectric conversion and stability with causing substantially no photo-deterioration.

EXAMPLE 9

A zinc oxide thin film was produced by using the apparatus shown in FIG. 1. However, in this example, the power source 105 was set so that the counter electrode 104 serves as the cathode.

As the conductive substrate 103 on the anode side, a substrate of stainless 430BA having a thickness of 0.15 mm, and comprising Ag deposited to 350 nm by sputtering, with the back covered with an insulating tape (not shown in the drawing), was used. As the counter electrode 104 on the cathode side, 4-N zinc having a thickness of 1 mm was used. The aqueous solution 102 was an aqueous solution of 0.025 mol/l zinc hydroxide in 12% ammonia at 62° C. and a pH of 10.4. The applied current was 1.2 mA/cm$^2$ (0.12 A/dm$^2$).

The thus-obtained electrodeposited film was examined by X-ray diffraction, and the deposition rate and reflectance at a wavelength of 800 nm were measured from optical characteristics. The results are shown in Table 4.

TABLE 4

| Type of electrodeposited film | Zinc oxide |
| --- | --- |
| Deposition rate ($\mu$m/h) | 2.2 |
| Reflectance (%) | 91 |

The above results indicate that an excellent zinc oxide thin film can be obtained by the method of producing a zinc oxide thin film of the present invention.

EXAMPLE 10

Electrodeposition was carried out by the same method as Example 9 except that as the conductive substrate 103, a substrate of stainless steel 430BA having a thickness of 0.15 mm, and comprising Ag deposited to 70 nm by sputtering and zinc oxide deposited to 110 nm on Ag by sputtering, with the back covered with an insulating tape (not shown in the drawing), was used.

The thus-obtained electrodeposited film was examined by X-ray diffraction, and the deposition rate and reflectance at a wavelength of 800 nm were measured from optical characteristics. The results are shown in Table 5.

TABLE 5

| Type of electrodeposited film | Zinc oxide |
| --- | --- |
| Deposition rate ($\mu$m/h) | 3.5 |
| Reflectance (%) | 73 |

The above results indicate that an excellent zinc oxide thin film can be obtained by the method of producing a zinc oxide thin film of the present invention.

EXAMPLE 11

The solar cell shown in FIGS. 3A and 3B and having the semiconductor layer having three p-i-n junctions, as shown in FIG. 4, was produced.

Specifically, the solar cell comprised the support 301-1 (conductive substrate of stainless steel, SUS430, 10×10 cm$^2$, thickness 0.2 mm), the metal layer 301-2 (Al), the transparent conductive layer 301-3 (zinc oxide thin film), the zinc oxide layer 302, the semiconductor layer 303, the transparent conductive layer 304, and the collecting electrodes 305 (Cu wire/Ag/C).

The metal layer 301-2 and the transparent conductive layer 301-3 were formed by the general vacuum deposition or sputtering method.

The zinc oxide layer 302 was formed by the same method as Example 1 except that 2 g/l of sucrose was added to the aqueous solution.

The semiconductor layer 303 was formed under the conditions shown in Table 6.

TABLE 6

| Semiconductor layer | Forming method | Deposition temperature (° C.) | Thickness ($\mu$m) |
| --- | --- | --- | --- |
| First doped layer n-type a-Si:H:P | RFCVD | 310 | 0.015 |
| First i layer a-SiGe:H | Microwave CVD | 290 | 0.1 |
| Second doped layer p type $\mu$c-Si:H:B | RFCVD | 240 | 0.01 |
| Third doped layer n-type a-Si:H:P | RFCVD | 240 | 0.01 |
| Second i layer a-SiGe:H | Microwave CVD | 280 | 0.07 |
| Fourth doped layer p-type $\mu$c-Si:H:B | RFCVD | 240 | 0.01 |
| Fifth doped layer n-type a-Si:H:P | RFCVD | 230 | 0.01 |
| Third i layer a-Si:H | RFCVD | 200 | 0.1 |
| Sixth doped layer p-type $\mu$c-Si:H:B | RFCVD | 165 | 0.01 |

The transparent conductive layer 304 was formed by the sputtering method.

As shown in FIG. 3B, on one side of the substrate on which the layers of up to the transparent conductive layer 304 were formed was applied the commercial insulating double side tape 307, and a Cu plate as the bus bar 306 was placed on the double side tape 307. The collecting electrodes comprising Cu wire/Ag/C were formed and then fused to the conductive layer 304 by heating and drying. Ten solar cells were produced (Examples 11-1 to 11-10).

For comparison, ten solar cells (Comparative Examples 11-1 to 11-10) were produced by the same method except that the zinc oxide layer 302 was formed by the general sputtering method without forming the transparent conductive layer 301-3.

First, the initial characteristics (photoconductive characteristics, short-circuit current) of these solar cells were measured.

As a result of measurement of the efficiency of photoelectric conversion and short-circuit photocurrent using a solar simulator (AM 1.5, 100 mW/cm$^2$, surface temperature 25° C.), on average, the efficiency of photoelectric conversion and short-circuit photocurrent of the photovoltaic devices (Examples 11-1 to 11-10) produced by using the method of forming a zinc oxide thin film of the present invention were 1.16 times and 1.17 times, respectively, as high as the comparative examples.

Then, as an acceleration test, a HH test (high-temperature high-humidity test) was performed. A solar cell was placed in an environmental test box and allowed to stand at a temperature of 84° C. and a humidity of 85% for 180 hours. The solar cell was then allowed in the environmental test box in which the temperature was set to 25° C., and humidity was set to 50% for 1 hour, and then removed. As a result of measurement of the efficiency of photoelectric conversion and short-circuit photocurrent, the efficiency of photoelectric conversion and short-circuit photocurrent of the photovoltaic devices (Examples 11-1 to 11-10) produced by using the method of forming a zinc oxide thin film of the present invention were 1.11 times and 1.13 times, respectively, as high as the comparative examples.

As described above, it was found that the photovoltaic device of the present invention is superior to conventional photovoltaic devices.

EXAMPLE 12

Figure 11:
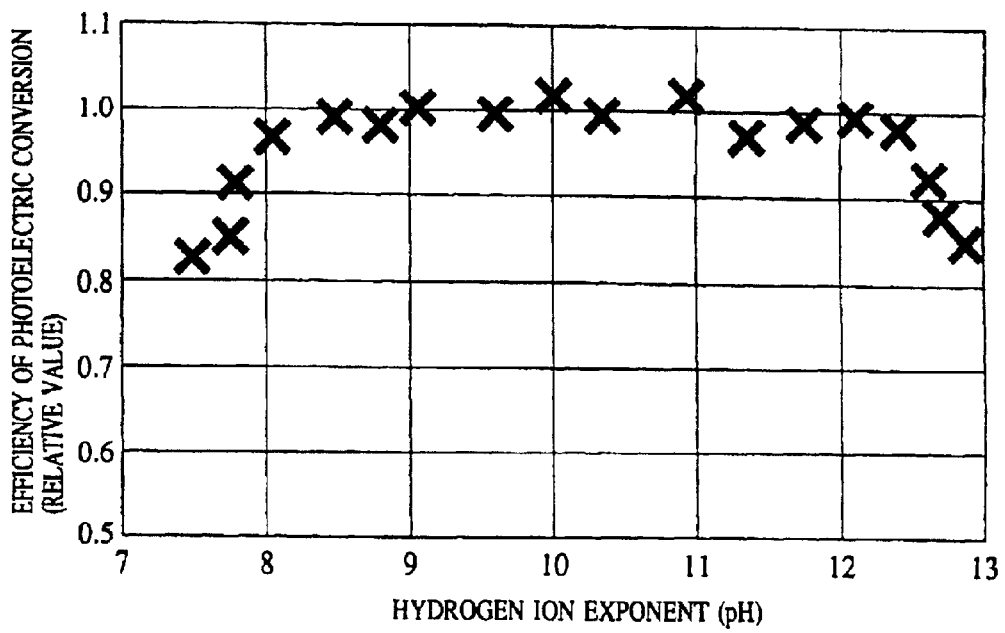
FIG. 11 is a graph showing the relation between the hydrogen ion exponent of an aqueous solution and efficiency of photoelectric conversion.

Solar cells were formed by the same method as Example 11 except that the pH of the aqueous solution was changed to 7.5 to 13 by using a pH buffer and a strong alkali aqueous solution. As shown in FIG. 11, the efficiency of photoelectric conversion was the maximum in the pH range of 8 to 12.5.

EXAMPLE 13

Figure 12:
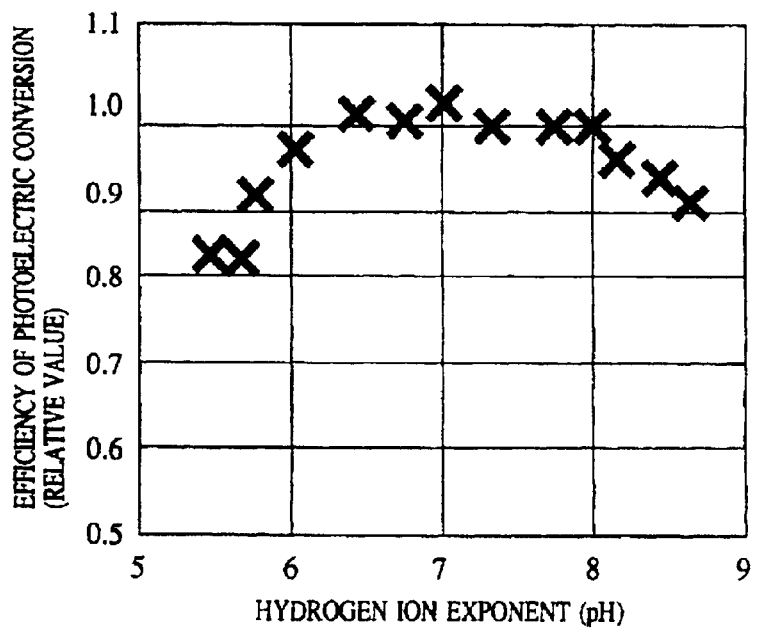
FIG. 12 is a graph showing the relation between the hydrogen ion exponent of an aqueous solution near the uppermost surface where a zinc oxide thin film is formed and efficiency of photoelectric conversion.

Solar cells were formed by the same method as Example 11 except that the hydrogen ion exponent of the aqueous solution near the uppermost surface where the zinc oxide thin film was formed was changed to pH 5.5 to 8.5 by using a 10% ammonia aqueous solution of 0.03 mol/l zinc oxalate at pH 10.2, weak acid and weak alkali pH buffers while changing the applied current. As shown in FIG. 12, the efficiency of photoelectric conversion was the maximum in the pH range of 6 to 8.

EXAMPLE 14

Figure 13:
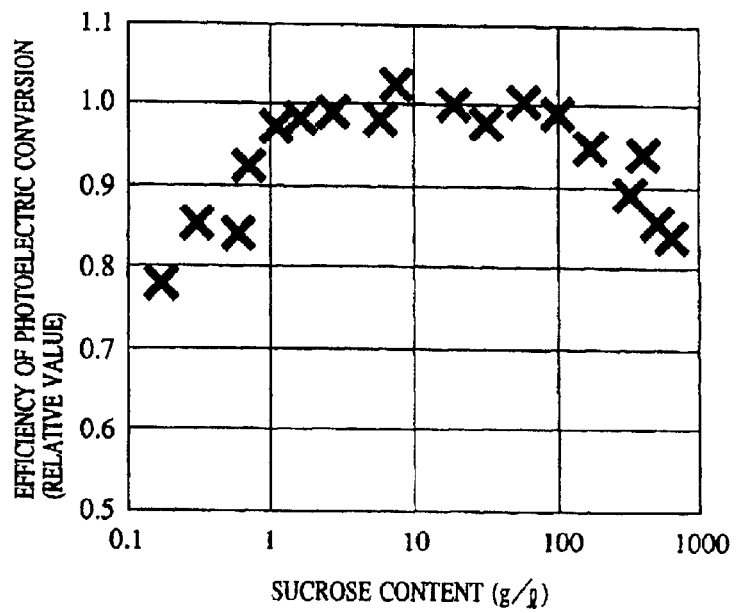
FIG. 13 is a graph showing the relation between the sucrose content of an aqueous solution and efficiency of photoelectric conversion.

Solar cells were formed by the same method as Example 11 except that the sucrose content was changed from 0 to 800 g/l. As shown in FIG. 13, the efficiency of photoelectric conversion was the maximum in the range of dextrin contents of 1 to 300 g/l.

SEM observation of a section of the transparent conductive layer showed significant abnormal growth of an erect plate-like shape at a sucrose content of 1 g/l or less. Therefore, the leakage current was decreased, thereby deteriorating the efficiency of photoelectric conversion. On the other hand, at a sucrose content of over 300 g/l, the shape was excessively flat, and thus insufficient for light confinement and light scattering, thereby deteriorating the efficiency of photoelectric conversion.

EXAMPLE 15

Figure 14:
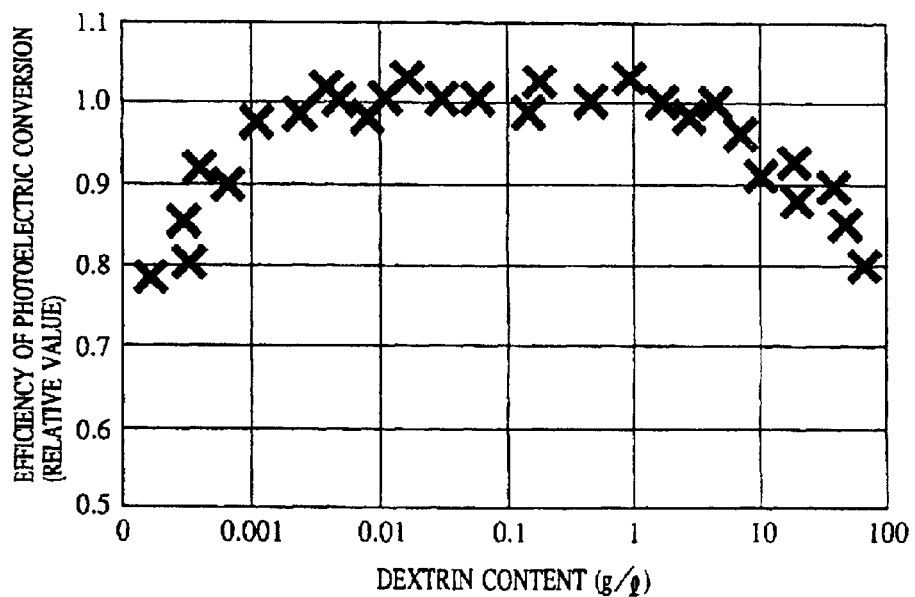
FIG. 14 is a graph showing the relation between the dextrin content of an aqueous solution and efficiency of photoelectric conversion.

Solar cells were formed by the same method as Example 11 except that the dextrin content was changed from 0 to 100 g/l. As shown in FIG. 14, the efficiency of photoelectric conversion was the maximum in the range of sucrose contents of 0.001 to 10 g/l.

SEM observation of a section of the transparent conductive layer showed significant abnormal growth of an erect plate-like shape at a dextrin content of 0.001 g/l or less. Therefore, the leakage current was decreased, thereby deteriorating the efficiency of photoelectric conversion. On the other hand, at a sucrose content of over 10 g/l, the shape was excessively flat, and thus insufficient for light confinement and light scattering, thereby deteriorating the efficiency of photoelectric conversion.

EXAMPLE 16

The GIGS type solar cell shown in FIG. 10 was produced.

Specifically, a blue glass plate on which Mo was deposited to 2.2 $\mu$m by sputtering was used as the substrate. On the substrate was formed a Cu—In—Ga—Se mixed crystal precursor at the substrate temperature of 210° C. by the simultaneous vaporization method. Then, the substrate was kept in a selenium atmosphere at 500° C. for 85 minutes to form a CIGS thin film. The substrate was placed in the aqueous solution for forming a zinc oxide thin film of the present invention, and the zinc oxide thin film of the present invention was electrolytically deposited on the surface of the CIGS thin film under irradiation of strong light in the same manner as Example 9. Characteristics of thus-obtained CIGS type solar cell were measured by the same method as Example 3. As a result, it was found that the solar cell has excellent initial efficiency of photoelectric conversion and stability with causing substantially no photo-deterioration.

EXAMPLE 17

A zinc oxide thin film was produced by using the apparatus shown in FIG. 1.

As the conductive substrate 103 on the cathode side, a substrate of stainless steel 430BA having a thickness of 0.12 mm, and comprising copper deposited to 200 nm by sputtering, with the back coated with an insulating tape (not shown in the drawing), was used. As the counter electrode 104 on the anode side, 4-N zinc having a thickness of 1 mm was used. The aqueous solution 102 was an aqueous solution of 0.025 mol/l zinc acetate 65° C. and a pH of 10.4. The applied current was 1.0 mA/cm$^2$ (0.1 A/dm$^2$).

The thus-obtained zinc oxide thin film was examined by X-ray diffraction, and the thickness and transmittance (in an atmosphere of a reference material) at a wavelength of 800 nm were measured from optical characteristics. Also the number of abnormal growths was visually examined. The results are shown in Table 7.

EXAMPLE 18

Electrodeposition was carried out by the same method as Example 17 except that the aqueous solution was an aqueous solution of 0.025 mol/l zinc formate at 65° C. The results are shown in Table 7.

EXAMPLE 19

Electrodeposition was carried out by the same method as Example 17 except that the aqueous solution was an aqueous solution of 0.025 mol/l zinc benzoate at 65° C. The results are shown in Table 7.

COMPARATIVE EXAMPLE 1

Electrodeposition was carried out by the same method as Example 17 except that the aqueous solution was an aqueous solution of 0.025 mol/l zinc nitrate at 65° C. The results are shown in Table 7.

TABLE 7

|  | Example 17 | Example 18 | Example 19 | Comparative Example 1 |
|---|---|---|---|---|
| Transmittance (%) | 75 | 78 | 68 | 58 |
| Thickness (nm) | 1020 | 980 | 750 | 580 |
| Type of electrodeposited film measured by X-ray diffraction | zinc oxide | zinc oxide | zinc oxide | zinc oxide |
| Number of abnormal growths visually measured | 0 | 0 | 0 | 123 |

Table 7 reveals that a zinc oxide thin film having excellent optical characteristics can be formed by electrodeposition of zinc oxide in an aqueous solution containing zinc ions and carboxylic acid ions.

EXAMPLE 20

Electrodeposition was carried out by the same method as Example 17 except that as the conductive substrate 103 on the cathode side, a substrate of stainless steel, 430BA having a thickness of 0.12 mm, and comprising Ag deposited to 200 nm by sputtering and ZnO deposited to 100 nm on Ag by sputtering, with the back coated with an insulating tape (not shown in the drawing), was used, and that the temperature of the aqueous solution was 70° C.

After electrodeposition, the number of abnormal growths of each of samples was measured in a region of 10 mm×10 mm. A peeling test was also carried out by bending the substrate of each of the samples. The results are shown in Table 8.

EXAMPLE 21

Electrodeposition was carried out by the same method as Example 20 except that as the conductive substrate 103 on the cathode side, a substrate of stainless steel 430BA having a thickness of 0.12 mm, and comprising Ag deposited to 200 nm by sputtering was used. The results are shown in Table 8.

TABLE 8

|  | Example 20 | Example 21 |
|---|---|---|
| Number of abnormal growths of 3μ or more (10 mm × 10 mm) | 5 | 92 |
| Result of test of bending at 180° | Neither peeling nor rack was observed. | No peeling was observed, but cracks of about 1 mm was observed. |

Table 8 indicates that by using as a substrate the conductive substrate on which the zinc oxide thin film is formed, it is possible to increase the deposition rate, decrease abnormal growth and form a zinc oxide thin film having excellent adhesion.

EXAMPLE 22

A zinc oxide thin film was produced by using the apparatus shown in FIG. 1.

As the conductive substrate 103 on the cathode side, a substrate of stainless steel, 430BA having a thickness of 0.12 mm, and comprising Ag deposited to 200 nm by sputtering and ZnO deposited on 100 nm on Ag by sputtering, with the back coated with an insulating tape (not shown in the drawing), was used. As the counter electrode 104 on the anode side, 4-N zinc having a thickness of 1 mm was used. The aqueous solution 102 was an aqueous solution of 0.05 mol/l zinc acetate at 65° C.: The applied current was 1.0 mA/cm$^2$ (0.1 A/dm$^2$). The pH of the aqueous solution was controlled by periodically adding 10% acetic acid.

Figure 17:
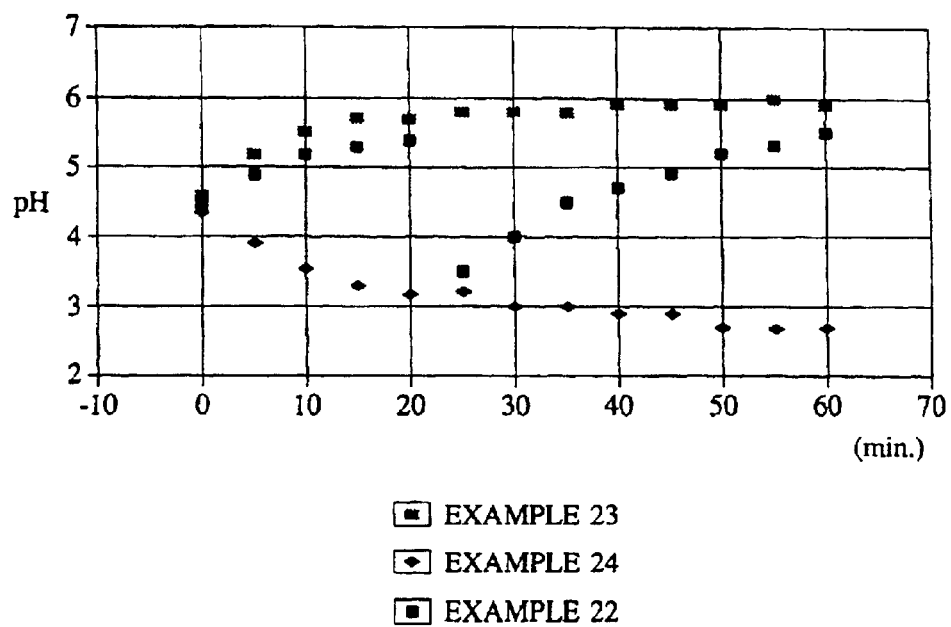
FIG. 17 is a graph showing changes in pH of an aqueous solution in Examples 22 to 24.

Samples were formed at intervals of 5 minutes in electrodeposition for a total time of 1 hour. FIG. 17 shows changes in pH at intervals of 5 minutes.

The total three samples formed in the periods of 0 to 5 minutes, 25 to 30 minutes, and 55 to 60 minutes were measured on transmittance, the thickness, and the number of abnormal growths in a region of 10 mm×10 mm by using SEM. The results are shown in Table 9.

EXAMPLE 23

Electrodeposition was carried out by the same method as Example 22 except that the pH of the aqueous solution was not controlled. The results are shown in FIG. 17 and Table 9.

EXAMPLE 24

Electrodeposition was carried out by the same method as Example 22 except that the counter electrode 104 was made of SUS304, and the pH of the aqueous solution was not controlled. The results are shown in FIG. 17 and Table 9.

TABLE 9

|  | Example 22 | | | Example 23 | | | Example 24 | | |
|---|---|---|---|---|---|---|---|---|---|
|  | 0–5 (min) | 25–30 (min) | 55–60 (min) | 0–5 (min) | 25–30 (min) | 55–60 (min) | 0–5 (min) | 25–30 (min) | 55–60 (min) |
| Thickness | 1.1 | 1.1 | 1.2 | 1 | 1.1 | 1 | 1 | 0.7 | No film |

TABLE 9-continued

|  | Example 22 | | | Example 23 | | | Example 24 | | |
| --- | --- | --- | --- | --- | --- | --- | --- | --- | --- |
|  | 0–5 (min) | 25–30 (min) | 55–60 (min) | 0–5 (min) | 25–30 (min) | 55–60 (min) | 0–5 (min) | 25–30 (min) | 55–60 (min) |
| Number of abnormal growths of $3\mu$ or more | 3 | 7 | 4 | 5 | 95 | 231 | 5 | 12 | No film |

Table 9 and FIG. 7 indicate that a zinc oxide thin film having excellent optical characteristics and less abnormal growth can be stably for a long period of time by controlling the aqueous solution in the pH range of 3.5 to 5.5.

EXAMPLE 25

Electrodeposition was carried out by the same method as Example 17 except that as the conductive substrate 103 on the cathode side, a substrate of stainless steel, 430BA having a thickness of 0.12 mm, and comprising Ag deposited to 200 nm by sputtering, with the back coated with an insulating tape (not shown in the drawing), was used.

Then, n-type amorphous silicon (a-Si) of 200 angstroms, nondoped amorphous silicon (a-Si) of 20 angstroms, and p-type microcrystalline silicon ($\mu$c-Si) of 140 angstroms were deposited in turn by the CVD method to form the semiconductor layer 303. Further, ITO of 650 angstroms was vapor-deposited by heating evaporation in an oxygen atmosphere to form the transparent conductive electrode 30 as an upper electrode having the antireflecting effect. On the upper electrode was deposited silver cladding by heating evaporation to form the collecting electrodes 305, to obtain the device shown in FIGS. 3A and 3B.

The short-circuit current density and efficiency of conversion of the device were measured under artificial sunlight. The device was further allowed to stand in an environment of temperature 85° C. and humidity of 85% for 1000 hours to measure the rate of deterioration of the efficiency of conversion. The results of measurement are shown in Table 10.

EXAMPLE 26

A device was produced by the same method as Example 25 except that the aqueous solution used was an aqueous solution of 0.025 mol/l zinc formate at 65° C. The results obtained are shown in Table 10.

EXAMPLE 27

A device was formed by the same method as Example 25 except that as the conductive substrate 103 on the cathode side, a substrate of stainless steel 430BA having a thickness of 0.12 mm, and comprising Ag deposited to 200 nm by sputtering and ZnO deposited to 100 nm by sputtering, with the back covered with an insulating tape (not shown in the drawing), was used. The results obtained are shown in Table 10.

COMPARATIVE EXAMPLE 2

A device was formed by the same method as Example 25 except that no zinc oxide thin film was formed. The results obtained are shown in Table 10.

COMPARATIVE EXAMPLE 3

A device was formed by the same method as Example 25 except that the aqueous solution used was an aqueous solution of 0.025 mol/l zinc nitrate at 65° C. The results obtained are shown in Table 10.

TABLE 10

|  |  | Example 25 | Example 26 | Example 27 | Comparative Example 2 | Comparative Example 3 |
| --- | --- | --- | --- | --- | --- | --- |
| Short-circuit current | Comparison to Comparative Example 2 | 1.2 | 1.2 | 1.3 | 1 | 1.15 |
| Conversion efficiency | Comparison to Comparative Example 2 | 1.15 | 1.1 | 1.2 | 1 | 1.1 |
| Rate of deterioration in conversion efficiency after HH test | (%) | 10 | 9 | 3 | 63 | 33 |

Table 10 reveals that a device having excellent short-circuit current, conversion efficiency and reliability can be formed by using the zinc oxide thin film of the present invention. It is also found that a device having higher reliability can be formed by using as a substrate the conductive substrate having the transparent conductive layer composed of the zinc oxide thin film deposited thereon.

EXAMPLE 28

Samples were formed at intervals of 5 minutes in the same manner as Example 22.

The total three samples formed in the periods of 0 to 5 minutes, 25 to 30 minutes, and 55 to 60 minutes were used for forming devices by the same method as Example 26.

The short-circuit current density and efficiency of conversion of each of the devices were measured under artificial sunlight. Each of the devices was further allowed to stand in an environment of temperature 85° C. and humidity of 85% for 1000 hours to measure the rate of deterioration of the efficiency of conversion. The results of measurement are shown in Table 11.

EXAMPLE 29

Devices were formed by the same method as Example 28 except that the pH of the aqueous solution was not controlled. The results obtained are shown in Table 11.

TABLE 11

|  |  | Example 28 | | | Example 29 | | |
| --- | --- | --- | --- | --- | --- | --- | --- |
|  |  | 0–5 (min) | 25–30 (min) | 55–60 (min) | 0–5 (min) | 25–30 (min) | 55–60 (min) |
| Efficiency of conversion | Relative comparison to Example 28 (0–5 min.) | 1 | 1 | 1 | 1 | 1 | 0.9 |
| Rate of deterioration in conversion efficiency after HH test | (%) | 3 | 5 | 4 | 4 | 18 | 32 |

Table 11 reveals that a device having excellent short-circuit current, efficiency of conversion and reliability can stably be formed for a long period of time by using a zinc oxide thin film formed by electrodeposition under control of the aqueous solution in the pH range of 3.5 to 5.5.

EXAMPLE 30

Figure 15:
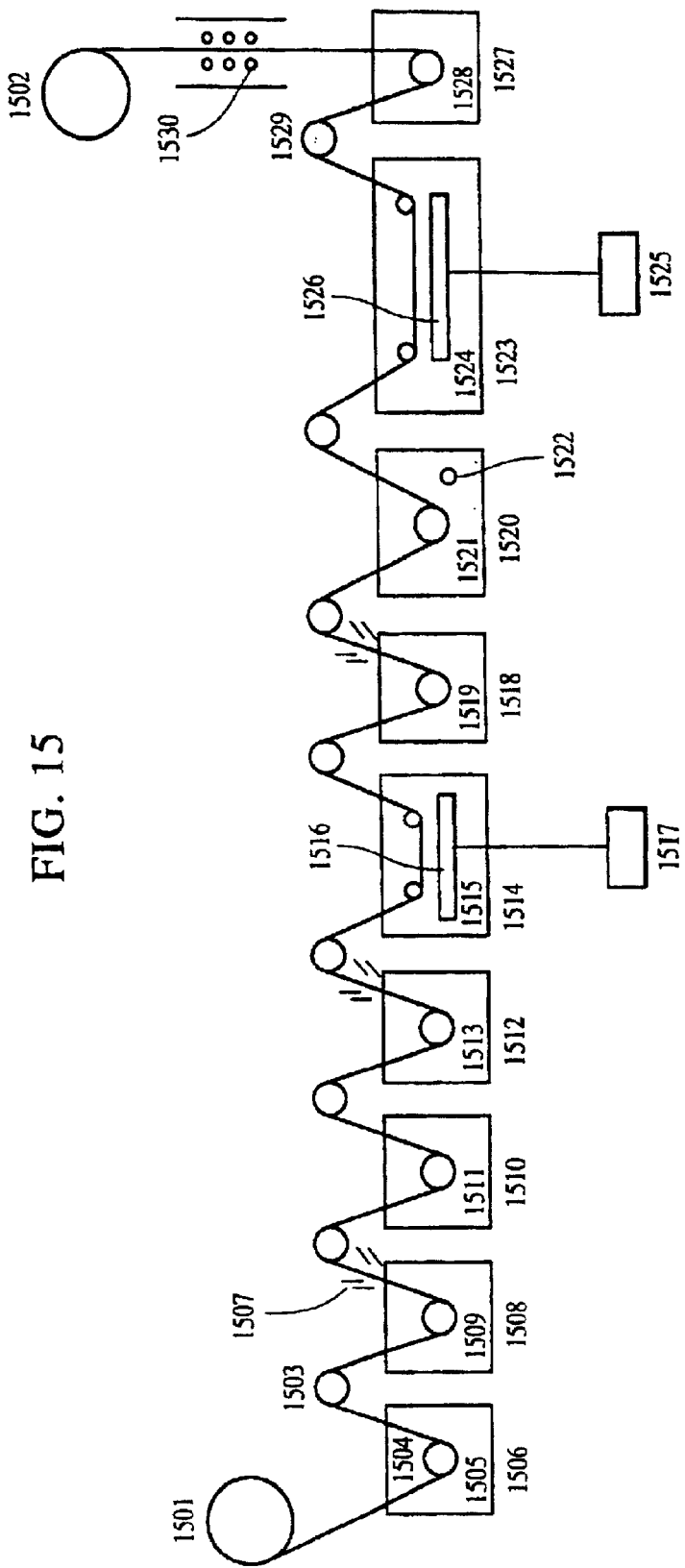
FIG. 15 is a schematic sectional view showing an example of apparatus for continuously producing a zinc oxide thin film of the present invention.

A zinc oxide thin film was formed by the continuous production method shown in FIG. 15 using as a support a roll of a stainless 430BA thin plate.

In FIG. 15, a stainless thin plate as a support roll 1503 is fed by a feeding roller 1501, and finally wound by a take-up roller 1502. Between the feeding roller 1501 and the take-up roller 1502 are provided in turn a degreasing tank 1506, a water washing tank 1508, an etching tank 1510, a water washing tank 1512, a metal layer forming tank 1514, a water washing tank 1518, a hot water tank 1520, a zinc oxide forming tank 1523, a water washing tank 1527, and a drying furnace 1529. In each of these tanks is provided a transfer roller 1504 for controlling the conveyance passage of the rolled support web 1503. The processing speed of the rolled support web 1503 was 200 cm/min. The tension applied to the rolled support web 1503 was 50 kgf. The tension was controlled by a tension controlling clutch (not shown in the drawing) provided in the take-up roller 1502.

The rolled support web 1503, was made rust proof with oil was later removed by the degreasing tank 1506. A degreasing bath 1505 comprised an aqueous solution containing 60 ml of sulfuric acid and 70 ml of hydrochloric acid (37% hydrogen chloride; the same is true for the example below) in 1 l water. The temperature was room temperature. The rolled support web 1503 was then transferred to the water washing tank 1508 through the transfer roller, and sufficiently washed with water by a water washing shower 1507. The amount of water is preferably at least 2 l per minute.

The rolled support web 1503 was then transferred to the etching tank 1510 through the transfer roller. The etching bath 1511 comprised a mixture containing hydrofluoric acid (46% hydrogen fluoride; the same is true for the example below) and acetic acid at a ratio of 3:1. The temperature was room temperature. The rolled support web 1503 was then transferred to the same water washing tank 1512 as the water washing tank 1508 after the degreasing tank 1506. Since the metal layer forming bath 1515 in the next step is alkaline, a weak alkali shower can also be used.

The rolled support web 1503 was then transferred to the metal layer forming bath 1515 through the transfer roller to form a metal layer. The metal layer forming bath 1515 comprised 80 g of copper pyrophosphate, 300 g of potassium pyrophosphate, 6 ml of ammonia water (specific gravity 0.88), and 10 g of potassium nitrate. The temperature was controlled to 50 to 60° C. The pH was controlled to be in the range of 8.2 to 8.8. As the counter electrode 1516 as the anode a copper plate was used. In this apparatus, since the rolled support web 1503 was set at the set potential, layer formation was controlled by reading the current in the counter electrode 1516. In this example, the current density was 3 A/dm$^2$. The rate of layer formation was 60 angstroms/sec, and the thickness of the metal layer formed in the metal layer forming bath 1515 was 4000 angstroms.

The rolled support web 1503 was then washed with water in the water washing tank 1518, sufficiently pre-heated by passing through the hot water tank 1520 kept at a pure water temperature 85° C. through the transfer roller, and transferred to the zinc oxide forming tank 1523. The zinc oxide forming bath 1524 comprised 10 g of zinc acetate hexahydrate in 1 l water. The liquid temperature was kept at 75° C., and the pH was kept at 4.5 to 5.5. As the counter electrode 1526, zinc having a puff-polished surface was used. The density of the current flowing in the zinc counter electrode 1526 was 5 A/dm$^2$. The formation rate was 30 Å/sec, and the thickness of the zinc oxide layer formed in the zinc oxide forming bath 1524 was 1 micron.

After water washing in the water washing tank 1527, the rolled support web 1503 was sent to the drying furnace 1529 through the transfer roller. The drying furnace comprised a hot air nozzle and an infrared heater which are not shown in the drawing, hot air being also used for repelling water. The hot air from the hot air nozzle was controlled to 80° C., and the infrared heater was controlled to 200° C.

The rolled support web 1503 passed through the drying step was wound as a roll comprising the metal layer 301-2 and the zinc oxide layer 302 both of which are formed on the support 301-1 on the take-up roller 1502.

The metal layer forming tank 1514 and the zinc oxide forming tank 1523 were stirred with air, and the pH values of the metal layer forming tank 1514 and the zinc oxide forming tank 1523 were controlled by adding ammonia and zinc nitrate, respectively, on occasion, while constantly monitoring pH of the bathes using a pH meter comprising a glass electrode in which the temperature was corrected.

On the thus-obtained substrate comprising the metal layer 301-2 and the zinc oxide layer 302 formed on the support 301-1 was formed the semiconductor layer 303 having a triple structure by the CVD apparatus for a roll.

First, a n-type layer was formed on the substrate heated to 340° C. by using mixed gases containing silane, phosphine and hydrogen with a RF power of 400 W charged, and then a i layer was formed on the substrate heated to 450° C. by using mixed gases containing silane, germane and hydrogen with a microwave power charged. Further, a p-type layer was formed on the substrate heated to 250° C. by using mixed gases containing boron trifluoride, silane and hydrogen, to form bottom pin layers. Then, middle nip layers were formed by the same procedure as the above at a increased mixing ratio of silane and germane, and top pin layers were formed by the same procedure except that the i layer was formed by using silane and hydrogen. Then ITO was deposited by a sputtering apparatus for a roll to form the transparent conductive layer 304, and the collecting electrodes 305 were formed by using silver paste.

The short-circuit current density and efficiency of conversion of the device were measured under artificial sunlight. The device was further allowed to stand in an environment of temperature 85° C. and humidity of 85% for 1000 hours to measure the rate of deterioration in the efficiency of conversion. The results of measurement are shown in Table 12.

EXAMPLE 31

Figure 16:
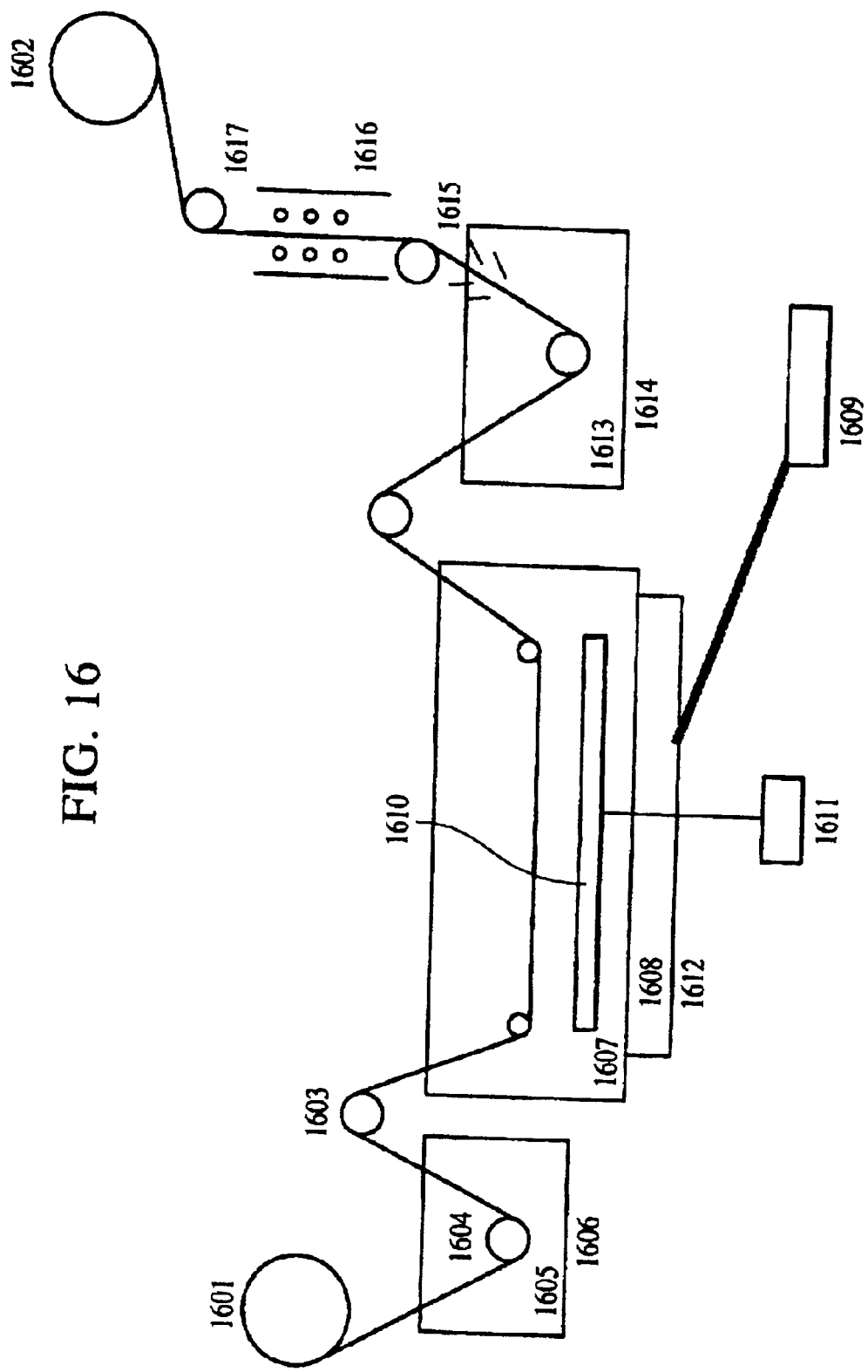
FIG. 16 is a schematic sectional view showing an example of apparatus for continuously producing a zinc oxide thin film of the present invention.

On the support 301-1 was deposited to 4000 angstroms copper by a CVD magnetron sputtering apparatus to form the metal layer 301-2. The zinc oxide layer 302 was formed on the metal layer 301-2 formed on the support 301-1 by using the apparatus shown in FIG. 16.

A support roll 1603 was first sufficiently heated in a hot water bath 1605 containing pure water kept at 85° C. in a hot water tank 1606, and then transferred to a zinc oxide layer forming tank 1612 through a transfer roller 1604.

A zinc oxide forming bath 1607 contained 10 g of zinc formate hexahydrate in 1 l water, and was provided with an ultrasonic vibrator 1608 (40 kHz) for ultrasonic processing by stirring the bath. The temperature of the bath was kept at 65° C., and the pH was kept at 4.0 to 5.0. As a counter electrode 1610, zinc having a puff-polished surface is used. The density of the current flowing in the zinc counter electrode 1610 was 5 A/dm$^2$. The formation rate was 30 Å/sec, and the thickness of the zinc oxide layer formed in the zinc oxide forming bath 1607 was 1 micron.

A device was formed on the thus-obtained substrate by the same method as Example 30. The results obtained are shown in Table 12.

TABLE 12

| | | Example 30 | Example 31 | Example 27 |
|---|---|---|---|---|
| Short-circuit current | Comparison to Example 27 | 0.9 | 0.9 | 1 |
| Conversion efficiency | Comparison to Example 27 | 0.95 | 0.92 | 1 |
| Rate of deterioration in conversion efficiency after HH test | (%) | 2 | 5 | 3 |

Table 12 reveals that the method of forming a zinc oxide thin film of the present invention has the sufficient effect of improving short-circuit current, conversion efficiency and reliability of a roll-to-roll system.

The aqueous solution for forming a zinc oxide thin film and the method of producing a zinc oxide thin film of the present invention are capable of forming a zinc oxide thin film having excellent characteristics. The method of producing a zinc oxide thin film of the present invention and the photovoltaic device formed by the same producing method permit improvements in photoconductive characteristics such as the conversion of photoelectric conversion, short-circuit photocurrent and leakage current of the photovoltaic device. Also it is possible to improve durability in an outdoor exposure test, a HH (high temperature high humidity) test and long-term light irradiation. Further, the cost of the photovoltaic device can significantly be decreased. Particularly, the power cost of a solar cell can be decreased.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A method of producing a zinc oxide thin film comprising passing a current between a conductive substrate immersed in an aqueous solution containing at least zinc ions, ammonium ions and a complex of zinc and ammonia ions, and an electrode as an anode immersed in the aqueous solution to form a zinc oxide thin film on the conductive substrate.

2. A method of producing a zinc oxide thin film according to claim 1, wherein the conductive substrate comprises a support and a transparent conductive layer deposited thereon.

3. A method of producing a zinc oxide thin film according to claim 1, wherein the hydrogen ion concentration of the aqueous solution is controlled in the range of pH 8 to pH 12.5.

4. A method of producing a zinc oxide thin film according to claim 1, wherein the hydrogen ion concentration of the aqueous solution near the uppermost surface in which the zinc oxide thin film is formed is controlled in the range of pH 6 to pH 8.

5. A method of producing a zinc oxide thin film according to claim 1, wherein the aqueous solution contains a hydrocarbon.

6. A method of producing a photovoltaic member comprising the steps of:

forming zinc oxide thin film on a conductive substrate immersed in an aqueous solution containing at least zinc ions, ammonium ions and a complex of zinc and ammonia ions by passing a current between the conductive substrate and an electrode as an anode immersed in the aqueous solution; and forming a semiconductor layer.

7. A method of producing a photovoltaic member according to claim 6, wherein the conductive substrate comprises a support and a transparent conductive layer deposited thereon.

8. A method of producing a photovoltaic member according to claim 6, wherein the hydrogen ion concentration of the aqueous solution is controlled in the range of pH 8 to pH 12.5.

9. A method of producing a photovoltaic member according to claim 6, wherein the hydrogen ion concentration of the aqueous solution near the uppermost surface in which the zinc oxide thin film is formed is controlled in the range of pH 6 to pH 8.

10. A method of producing a photovoltaic member according to claim 6, wherein the aqueous solution contains a hydrocarbon.

11. A method of producing a semiconductor device substrate comprising passing a current between a conductive substrate immersed in an aqueous solution containing at least zinc ions, ammonium ions and a complex of zinc and ammonia ions, and an electrode as an anode immersed in the aqueous solution to form a zinc oxide thin film on the conductive substrate.

12. A method of producing a semiconductor device substrate according to claim 11, wherein the conductive substrate comprises a support and a transparent conductive layer deposited thereon.

13. A method of producing a semiconductor device substrate according to claim 11, wherein the hydrogen ion concentration of the aqueous solution is controlled in the range of pH 8 to pH 12.5.

14. A method of producing a semiconductor device substrate according to claim 11, wherein the hydrogen ion concentration of the aqueous solution near the uppermost surface in which the zinc oxide thin film is formed is controlled in the range of pH 6 to pH 8.

15. A method of producing a semiconductor device substrate according to claim 11, wherein the aqueous solution contains a hydrocarbon.

* * * * *